United States Patent
Koyama et al.

(10) Patent No.: US 9,716,025 B2
(45) Date of Patent: Jul. 25, 2017

(54) TEMPORARY BONDING LAMINATES FOR USE IN MANUFACTURE OF SEMICONDUCTOR DEVICES

(71) Applicant: FUJIFILM Corporation, Minato-ku, Tokyo (JP)

(72) Inventors: Ichiro Koyama, Haibara-gun (JP); Yu Iwai, Haibara-gun (JP); Masafumi Yoshida, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 14/865,961

(22) Filed: Sep. 25, 2015

(65) Prior Publication Data
US 2016/0035612 A1    Feb. 4, 2016

Related U.S. Application Data

(63) Continuation of application No. PCT/JP2014/058722, filed on Mar. 27, 2014.

(30) Foreign Application Priority Data

Mar. 27, 2013    (JP) ................................ 2013-066655

(51) Int. Cl.
  *H01L 21/30* (2006.01)
  *H01L 21/683* (2006.01)
  *C09J 7/02* (2006.01)

(52) U.S. Cl.
  CPC ........ *H01L 21/6835* (2013.01); *C09J 7/0225* (2013.01); *C09J 2201/622* (2013.01);
  (Continued)

(58) Field of Classification Search
  CPC ................ C09J 7/0225; C09J 2201/622; C09J 2203/326; H01L 21/324; H01L 21/6835;
  (Continued)

(56) References Cited

U.S. PATENT DOCUMENTS 8,466,041 B2    6/2013 Kuroda et al.
8,609,229 B2    12/2013 Kondo
(Continued)

FOREIGN PATENT DOCUMENTS

CN    102481764 A    5/2012
JP    2007-045939 A    2/2007
(Continued)

OTHER PUBLICATIONS

International Preliminary Report on Patentability issued from the International Bureau in counterpart International Application No. PCT/JP2014/058722, mailed on Oct. 8, 2015.
(Continued)

*Primary Examiner* — Thanh T Nguyen
(74) *Attorney, Agent, or Firm* — Sughrue Mion, PLLC

(57) ABSTRACT

Provided is temporary bonding laminates for used in a manufacture of semiconductor devices, by which a member to be processed (a semiconductor wafer or the like) can be temporarily supported securely and readily during a mechanical or chemical process of the member to be processed and then the processed member can be readily released from the temporary support without damaging the processed member even after a high temperature process, and processes for manufacturing semiconductor devices. The temporary bonding laminate includes (A) a release layer and (B) an adhesive layer, wherein the release layer (A) comprises (a1) a first release layer having a softening point of 200° C. or more and adjoining the adhesive layer (B), and (a2) a second release layer adjoining the first release layer (a1); the second release layer (a2) contains a resin; and the resin after curing has a capable of being dissolved at 5% by mass or more, at 25° C., in at least one kind of solvents selected from hexane and the like.

11 Claims, 5 Drawing Sheets

(52) U.S. Cl.
CPC . *C09J 2203/326* (2013.01); *H01L 2221/6834* (2013.01); *H01L 2221/68318* (2013.01); *H01L 2221/68327* (2013.01); *H01L 2221/68381* (2013.01); *H01L 2221/68386* (2013.01)

(58) Field of Classification Search
CPC . H01L 2221/68318; H01L 2221/68327; H01L 2221/6834; H01L 2221/68381; H01L 2221/68386
See application file for complete search history.

(56) References Cited

U.S. PATENT DOCUMENTS

| | | | |
|---|---|---|---|
| 8,911,583 | B2 | 12/2014 | Jakob |
| 2010/0043608 | A1 | 2/2010 | Jakob |
| 2010/0314043 | A1* | 12/2010 | Imai ............... C09J 5/00 156/289 |
| 2011/0136321 | A1 | 6/2011 | Kuroda et al. |
| 2011/0318938 | A1 | 12/2011 | Takeuchi et al. |
| 2012/0171454 | A1* | 7/2012 | Kondo ............. B32B 17/10 428/220 |
| 2015/0194331 | A1* | 7/2015 | Bai ............... H01L 21/6835 257/783 |

FOREIGN PATENT DOCUMENTS

| | | |
|---|---|---|
| JP | 2009-528688 A | 8/2009 |
| JP | 2010-506406 A | 2/2010 |
| JP | 2011-052142 A | 3/2011 |
| JP | 2011-510518 A | 3/2011 |
| JP | 2011-119427 A | 6/2011 |
| JP | 2011-225814 A | 11/2011 |
| WO | 2008/045669 A1 | 4/2008 |
| WO | 2009/094558 A2 | 7/2009 |

OTHER PUBLICATIONS

International Search Report for PCT/JP2014/058722 dated Jun. 24, 2014.
Written Opinion for PCT/JP2014/058722 dated Jun. 24, 2014.
Office Action dated Feb. 22, 2017 from the Korean Intellectual Property Office in counterpart Korean Application No. 10-2015-7025913.
Office Action dated Dec. 30, 2016 from the State Intellectual Property Office of the P.R.C., in counterpart Chinese Application No. 201480018461.X.

* cited by examiner

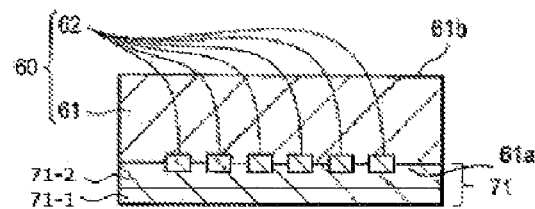
Fig. 1A
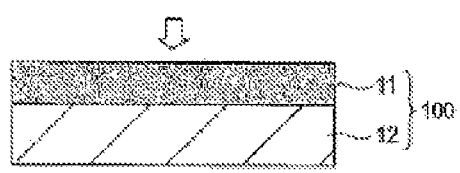
Fig. 1B

Fig. 2
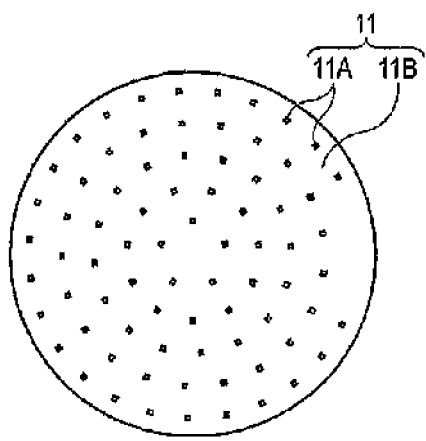

Fig. 12
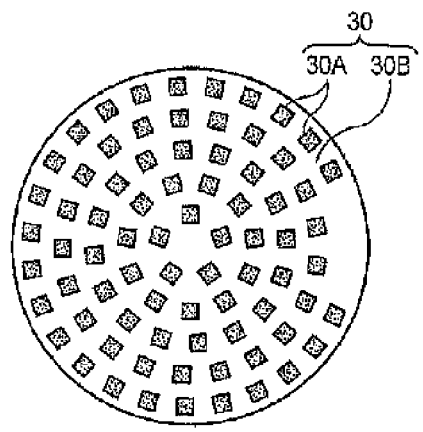
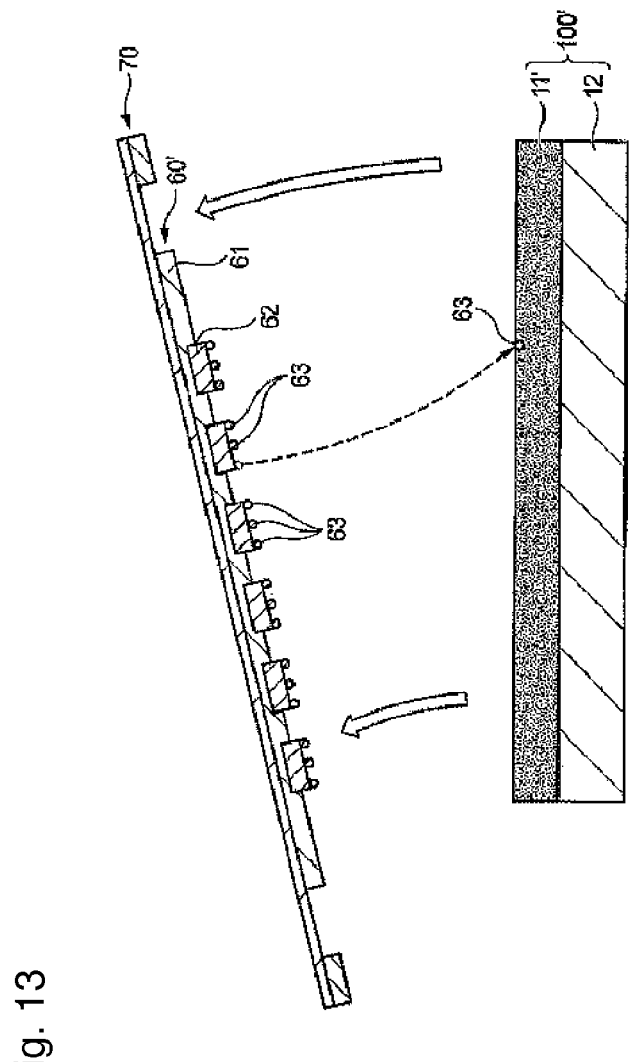
Fig. 13

TEMPORARY BONDING LAMINATES FOR USE IN MANUFACTURE OF SEMICONDUCTOR DEVICES

CROSS-REFERENCE TO RELATED APPLICATIONS

This application is a Continuation of PCT International Application No. PCT/JP2014/058722 filed on Mar. 27, 2014, which claims priority under 35 U.S.C §119(a) to Japanese Patent Application No. 2013-066655 filed on Mar. 27, 2013. Each of the above application(s) is hereby expressly incorporated by reference, in its entirety, into the present application.

TECHNICAL FIELD

The present invention relates to temporary bonding laminates for used in a manufacture of semiconductor devices and processes for manufacturing semiconductor devices.

BACKGROUND ART

Conventional manufacturing processes of semiconductor devices such as ICs and LSIs typically comprise forming a number of IC chips on a semiconductor silicon wafer and singulating it by dicing.

The demand for smaller electronic equipment with higher performance also leads to a demand for smaller IC chips with a higher degree of integration incorporated into the electronic equipment, but the density of integrated circuits in the direction of the plane of silicon substrates is close to the limit.

Wire bonding is a conventionally widely known technique for electrically connecting integrated circuits in IC chips to external terminals of the IC chips, and an alternative technique suitable for smaller IC chips has also recently been known, which comprises forming through-holes in a silicon substrate and connecting metal plugs as external terminals to integrated circuits via the through-holes (so-called, a method of forming a through-silicon electrode (TSV)). However, the technique comprising forming through-silicon vias alone cannot sufficiently meet the recent demand for IC chips with a higher degree of integration.

To overcome the drawbacks described above, a technique is known for improving the degree of integration per unit area of silicon substrates by providing multilayer integrated circuits in IC chips. However, the multilayer integrated circuits increase the thickness of the IC chips so that components of the IC chips must be thinned. Such components suggested to be thinned include, for example, silicon substrates, and this is a promising solution because it allows not only for reducing the size of IC chips but also for saving labor in the step of forming through-holes in silicon substrates during the preparation of through-silicon vias.

The semiconductor silicon wafer used in a method for manufacturing semiconductor device, are widely known to have a thickness of about 700 to 900 µm. Recently, for the purpose of miniaturization or the like of an IC chip, it has been attempted to reduce the thickness of the semiconductor silicon wafer to be 200 µm or less. To reduce the size of IC chips or for other purposes, attempts have recently been made to reduce the thickness of semiconductor silicon wafers to be 200 µm or less.

However, semiconductor silicon wafers having a thickness of 200 µm or less are so thin and therefore, components for manufacturing semiconductor devices using them as base materials are also so thin that such components are hard to stably support without damaging them during further processing or simply transferring or otherwise handling such components.

To solve the problems as described above, a known technique comprises temporarily bonding an unthinned semiconductor wafer having devices on its surface to a supporting substrate for processing using a silicone adhesive; thinning the semiconductor wafer by backgrinding; then drilling the semiconductor wafer to form through-silicon vias; and then debonding the supporting substrate for processing from the semiconductor wafer (see patent document 1). It is said that this technique allows for achieving resistance to grinding during backgrinding of the semiconductor wafer, heat resistance during an anisotropic dry etching process or the like, chemical resistance during plating or etching, smooth separation from the supporting substrate for processing at the final stage and low contamination on the wafer at the same time.

A technique for supporting a wafer by a carrier layer system is also known, comprising inserting a plasma polymer layer obtained by plasma deposition as a separation layer between the wafer and the carrier layer system in such a manner that the bond strength between the carrier layer system and the separation layer is greater than the bond strength between the wafer and the separation layer, whereby the wafer is readily debonded from the separation layer when the wafer is debonded from the carrier layer system (see patent document 2).

Another known technique comprises a temporary bonding step using a polyether sulfone and a tackifier, and a debonding step by heating (patent document 3).

Another known technique comprises a temporary bonding step using a mixture of a carboxylic acid and an amine, and a debonding step by heating (patent document 4).

Another known technique comprises bonding a device wafer and a carrier substrate under pressure via a heated bonding layer formed of a cellulose polymer or the like, and debonding the device wafer from the carrier substrate by heating and sliding apart them in a transverse direction (patent document 5).

Further, an adhesive film comprising syndiotactic 1,2-polybutadiene and a photoinitiator is known, wherein the bond strength of the film can be changed by irradiation (patent document 6).

Another known technique comprises temporarily bonding a carrier substrate and a semiconductor wafer using an adhesive formed of a polycarbonate, processing the semiconductor wafer, then irradiating it, and then debonding the processed semiconductor wafer from the carrier substrate by heating (patent document 7).

Further, a known technique for temporarily bonding a device surface of a device wafer having microdevices and a carrier substrate supporting the device wafer comprises temporarily bonding a peripheral region of the device surface and the carrier substrate with an adhesive via a fill layer not participating in bonding inserted between a central region of the device surface and the carrier substrate (patent document 8).

REFERENCES

Patent Documents

Patent document 1: JPA2011-119427;
Patent document 2: JPA2009-528688;
Patent document 3: JPA2011-225814;

Patent document 4: JPA2011-052142;
Patent document 5: JPA2010-506406;
Patent document 6: JPA2007-045939;
Patent document 7: US Patent Application Publication No. 2011/0318938;
Patent document 8: JPA2011-510518.

SUMMARY OF THE INVENTION

Problems to be Solved by the Invention

When a surface of a semiconductor wafer having devices (i.e., a device surface of a device wafer) and a supporting substrate (carrier substrate) are to be temporarily bonded via a layer formed of an adhesive known from patent document 1 or the like, the adhesive layer must have enough adhesiveness to stably support the semiconductor wafer.

Thus, when the entire device surface of a semiconductor wafer and a supporting substrate are to be temporarily bonded via an adhesive layer, the following problem is likely to occur: the temporary bond between the semiconductor wafer and the supporting substrate must be enough strong to stably support the semiconductor wafer without damaging it, but the temporary bond between the semiconductor wafer and the supporting substrate is so strong that devices may be broken or separated from the semiconductor wafer when the semiconductor wafer is debonded from the supporting substrate.

Further, the method comprising forming a plasma polymer layer as a separation layer by plasma deposition between a wafer and a carrier layer system to prevent the wafer and the carrier layer system from being bonded too strongly as described in patent document 2 has the following drawbacks: (1) the equipment for performing plasma deposition typically requires much cost; (2) the layer formation by plasma deposition requires a considerable time for evacuation in a plasma deposition system or deposition of a monomer; and (3) even if a separation layer formed of a plasma polymer layer is inserted, it is not easy to control the bond strength in such a manner that the bond strength between the wafer and the separation layer is enough when the wafer to be processed is supported, while the wafer is readily debonded from the separation layer when the wafer is released from the support.

Further, the method comprising a debonding step by heating as described in patent documents 3, 4 and 5 is likely to encounter the problem that devices may be broken by lengthy heating.

Further, the method comprising a debonding step by irradiation as described in patent documents 6 and 7 necessitates the use of a radiation-transparent carrier substrate.

Further, the method comprising inserting a fill layer not participating in bonding on a carrier as described in patent document 8 must comprise a multistage process for forming the fill layer, and therefore it should be further improved in productivity.

The present invention was made under the circumstances described above, and aims to provide temporary bonding laminates for used in a manufacture of semiconductor devices, by which a member to be processed (a semiconductor wafer or the like) can be temporarily supported securely and readily during a mechanical or chemical process of the member to be processed and then the processed member can be readily released from the temporary support without damaging the processed member even after a high temperature process, and processes for manufacturing semiconductor devices.

Means for Solving the Problems

As a result of our careful studies to solve the problems described above, we achieved the present invention on the basis of the finding that the processed member can be readily released from the temporary support even after a high temperature process if a temporary bonding laminate comprising a release layer and an adhesive layer is inserted between a support and a member to be processed wherein the release layer in the temporary bonding laminate comprises a first release layer having a specific softening point and a second release layer containing a solvent-soluble resin. Thus, the present invention provides the following.

Specifically, the problems were solved by the solving means <1>, preferably by solving means <2> to <12> below.
<1> A temporary bonding laminate for used in a manufacture of semiconductor devices, comprising (A) a release layer and (B) an adhesive layer, wherein the release layer (A) comprises (a1) a first release layer having a softening point of 200° C. or more and adjoining the adhesive layer (B), and (a2) a second release layer adjoining the first release layer (a1); the second release layer (a2) contains a resin; and the resin after curing has a capable of being dissolved at 5% by mass or more, at 25° C., in at least one kind of solvents selected from hexane, heptane, ethyl acetate, acetone, methanol, ethanol, isopropanol, 1,4-dioxane, tetrahydrofuran, 1-methoxy-2-propanol, 2-acetoxy-1-methoxypropane, acetonitrile, methyl ethyl ketone, cyclohexanone, toluene, dimethyl sulfoxide, N,N-dimethylformamide, N,N-dimethylacetamide, N-methyl-2-pyrrolidinone, N-ethyl-2-pyrrolidinone, chloroform, methylene chloride, anisole, xylene, and mesitylene.
<2> The temporary bonding laminate for used in a manufacture of semiconductor devices according to <1>, wherein the first release layer (a1) has a softening point in the range of 200° C. to 450° C.
<3> The temporary bonding laminate for used in a manufacture of semiconductor devices according to <1> or <2>, wherein the first release layer (a1) contains a thermoplastic resin.
<4> The temporary bonding laminate for used in a manufacture of semiconductor devices according to <3>, wherein thermoplastic resin is at least one thermoplastic resin selected from polyether sulfone resins, polyimide resins, polyester resins, polybenzimidazole resins, polyphenylene ether resins, polyphenylene sulfide resins, polyamideimide resins and polyether ketone resins.
<5> The temporary bonding laminate for used in a manufacture of semiconductor devices according to any one of <1> to <4>, wherein the resin contained in the second release layer (a2) is at least one member selected from polycarbonate resins, polyurethane resins and hydrocarbon resins.
<6> The temporary bonding laminate for used in a manufacture of semiconductor devices according to any one of <1> to <5>, wherein the adhesive layer (B) comprises a binder, a polymerizable monomer, and at least one of a photoinitiator and a thermal polymerization initiator.
<7> The temporary bonding laminate for used in a manufacture of semiconductor devices according to any one of <1> to <6>, wherein the first release layer (a1) has a thickness of 1 to 10 μm and the second release layer (a2) has a thickness of 20 to 100 μm.

<8> A method for manufacturing a semiconductor device, comprising bonding a first surface of a member to be processed and a substrate via the temporary bonding laminate for used in a manufacture of semiconductor devices according to any one of <1> to <7>; subjecting the member to be processed to a heat treatment having a maximum attainable temperature in the range of 180° C. to 370° C. to give a processed member; and debonding the processed member from the bonding layers; wherein the first release layer has a softening point higher than the maximum attainable temperature in the heat treatment.

<9> The method for manufacturing a semiconductor device according to <8>, further comprising irradiating the adhesive layer of the temporary bonding laminate with active rays or radiation or heat before bonding the first surface of the member to be processed and the substrate via the temporary bonding laminate.

<10> The method for manufacturing a semiconductor device according to <8> or <9>, further comprising removing the temporary bonding laminate remaining on the processed member with a stripping solvent after debonding the processed member from the temporary bonding laminate.

<11> The method for manufacturing a semiconductor device according to anyone of <8> to <10>, wherein the stripping solvent comprises at least one of a hydrocarbon solvent and an ether solvent.

<12> The method for manufacturing a semiconductor device according to <11>, wherein the stripping solvent comprises at least one of cyclopentane, n-hexane, cyclohexane, n-heptane, limonene, p-menthane, tetrahydrofuran (THF), 1,3-dioxolane, and anisole.

<13> A kit including a stripping solvent, comprising a release layer forming composition containing a thermoplastic resin, and an adhesive layer forming composition containing a resin capable of being dissolved at 5% by mass or more in at least one of solvents selected from hexane, heptane, ethyl acetate, acetone, methanol, ethanol, isopropanol, 1,4-dioxane, tetrahydrofuran, 1-methoxy-2-propanol, 2-acetoxy-1-methoxypropane, acetonitrile, methyl ethyl ketone, cyclohexanone, toluene, dimethyl sulfoxide, N,N-dimethylformamide, N,N-dimethylacetamide, N-methyl-2-pyrrolidinone, N-ethyl-2-pyrrolidinone, chloroform, methylene chloride, anisole, xylene, and mesitylene at 25° C. after curing.

<14> The kit according to <13>, further comprising a stripping solvent including at least one of a hydrocarbon solvent and an ether solvent.

Advantages of the Invention

The present invention makes it possible to provide temporary bonding laminates for used in a manufacture of semiconductor devices, by which a member to be processed can be temporarily supported securely and readily during a mechanical or chemical process of the member to be processed and then the processed member can be readily released from the temporary support without damaging the processed member even after a high temperature process, and processes for manufacturing semiconductor devices.

BRIEF EXPLANATION OF THE DRAWINGS

FIG. 1A, FIG. 1B and FIG. 1C are a schematic sectional view illustrating how to temporarily bond an adhesive support and a device wafer, a schematic sectional view showing the device wafer temporarily bonded to the adhesive support, and a schematic sectional view showing the device wafer temporarily bonded to the adhesive support after it has been thinned, respectively.

FIG. 2 is a schematic top view of an adhesive support according to an embodiment of the present invention.

FIG. 12 is a schematic top view of an adhesive support according to an embodiment of the present invention.

FIG. 13 is a schematic sectional view illustrating how an adhesive support and a device wafer are released from a temporary bond according to a prior art.

DESCRIPTION OF EMBODIMENTS

Figure 1C:
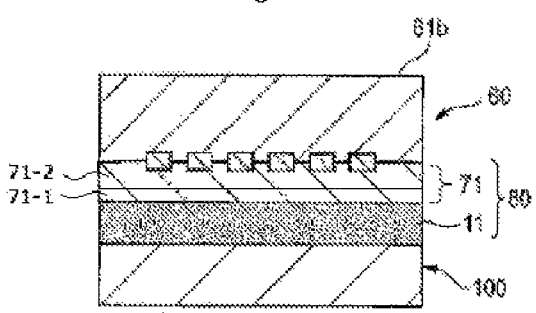

The present invention will be explained in detail below.

In this specification, notation of group (atomic group) without being preceded by "substituted" or "unsubstituted", is used to encompass not only group having no substituent, but also group having substituent. For example, "alkyl group" encompass not only alkyl group having no substituent (unsubstituted alkyl group), but also alkyl group having substituent (substituted alkyl group). In the present specification, the term "monomer" and "monomer" is synonymous.

In this specification, "actinic rays" and "radiation" means, for example, those with visible light, ultraviolet light, far ultraviolet rays, electron beams, X-rays or the like. Further, in the present invention, "light", it means actinic rays or radiation.

In this specification, "exposure", unless otherwise indicated, exposure with far ultraviolet rays typified by mercury lamp, ultraviolet rays, excimer laser, X-ray, EUV light or the like, and a drawing with a particle beam such as an electron beam and ion beam.

In this specification, "(meth)acrylate" means acrylate and methacrylate, "(meth)acryl" means acryl and methacryl, "(meth)acryloyl" means acryloyl and methacryloyl. The monomer in the present invention is discriminated from oligomer and polymer, and means any compound having a weight-average molecular weight of 2,000 or smaller. In this specification, the polymerizable compound means any compound having a polymerizable functional group, and may be a monomer or polymer. The polymerizable functional group means any group participating a polymerization reaction.

In the embodiments described below, for the members and the like described in the previously referenced drawings are simplified or omitted of explanation are denoted by the same reference numerals or corresponding reference numerals in the figures.

The temporary bonding laminates for used in a manufacture of semiconductor devices according to the present invention (hereinafter also simply referred to as "temporary bonding laminates") comprise (A) a release layer and (B) an adhesive layer, wherein the release layer (A) comprises (a1) a first release layer having a softening point of 200° C. or more and adjoining the adhesive layer (B) and (a2) a second release layer containing a resin capable of being dissolved at 5% by mass or more in at least one of solvents selected from hexane, heptane, ethyl acetate, acetone, methanol, ethanol, isopropanol, 1,4-dioxane, tetrahydrofuran, 1-methoxy-2-propanol, 2-acetoxy-1-methoxypropane, acetonitrile, methyl ethyl ketone, cyclohexanone, toluene, dimethyl sulfoxide, N,N-dimethylformamide, N,N-dimethylacetamide, N-methyl-2-pyrrolidinone, N-ethyl-2-pyrrolidinone, chloroform, methylene chloride, anisole, xylene, and mesitylene at 25° C. after curing and adjoining the first release layer (a1).

The temporary bonding laminates for used in a manufacture of semiconductor devices according to the present invention are preferably used in a manufacture of semiconductor devices comprising performing a heat treatment.

The temporary bonding laminates for used in a manufacture of semiconductor devices according to the present invention provide temporary bonding laminates for used in a manufacture of semiconductor devices, by which a member to be processed can be temporarily supported securely and readily during a mechanical or chemical process of the member to be processed and then the processed member can be readily released from the temporary support without damaging the processed member even after a high temperature process.

The temporary bonding laminates for used in a manufacture of semiconductor devices according to the present invention are preferably used for forming through-silicon vias. The formation of through-silicon vias will be explained in detail later.

<(A) Release Layer>

The release layer comprises (a1) a first release layer adjoining the adhesive layer, and (a2) a second release layer adjoining the first release layer. Thus, the first release layer, the second release layer, and the adhesive layer are laminated in this order in the present invention. The first release layer (a1) and the second release layer (a2) may be each provided as a single layer, but may also be provided as two or more layers.

<<First Release Layer>>

In the present invention, the first release layer is used for the purpose of improving releasability. Therefore, the first release layer should have releasability less influenced by heat/chemicals. To meet such requirements, the first release layer has a softening point of 200° C. or more in the present invention. Preferably, the softening point is 200° C. to 450° C., more preferably 250° C. to 400° C., even more preferably 280° C. to 350° C. The softening point of the first release layer refers to the value measured by a conventional method using a viscoelastometer.

This seems to prevent the resin of the first release layer from melting or undergoing a glass transition by heat and therefore from being excessively promoted to be bonded to the adhesive layer during the manufacturing process of semiconductor devices comprising performing a heat treatment, whereby the processed member is smoothly separated.

If the softening point of the first release layer is less than 200° C., the resin of the first release layer seems to melt or undergo a glass transition so that it is bonded to the adhesive layer with excessively high strength during the manufacturing process of semiconductor devices comprising performing a heat treatment, whereby the processed member is not smoothly separated.

The softening point of the release layer is determined as the temperature at which the loss tangent (tan δ) measured using a viscoelastometer under predetermined heating conditions is maximum.

The loss tangent (tan δ) is calculated by the equation below:

$$\tan \delta = G''/G'$$

wherein G" represents shear loss modulus, and G' represents shear storage modulus.

The heating rate is preferably in the range of 0.5 to 20° C./min, more preferably in the range of 1 to 10° C./min, especially preferably in the range of 2 to 5° C./min.

<<<Binder>>>

In the present invention, the first release layer preferably contains a binder as a main component.

In the present invention, any binders can be used as the binder contained in the first release layer.

For example, they include synthetic resins such as terpene resins, terpene phenol resins, modified terpene resins, hydrogenated terpene resins, hydrogenated terpene phenol resins, rosins, rosin esters, hydrogenated rosins, hydrogenated rosin esters, polymerized rosins, polymerized rosin esters, modified rosins, rosin-modified phenolic resins, alkyl phenolic resins, aliphatic petroleum resins, aromatic petroleum resins, hydrogenated petroleum resins, modified petroleum resins, alicyclic petroleum resins, coumarone petroleum resins, indene petroleum resins, olefin copolymers (e.g., methylpentene copolymers), cycloolefin copolymers (e.g., norbornene copolymers, dicyclopentadiene copolymers, tetracyclododecene copolymers), novolac resins, phenolic resins, epoxy resins, melamine resins, urea resins, unsaturated polyester resins, alkyd resins, polyurethane resins, polyimide resins, polyethylene resins, polypropylene resins, polyvinyl chloride resins, polystyrene resins, polyvinyl acetate resins, PTFE resins, PFA resins, FEP resins, ethylene-TFE copolymer resins, PVDF resins, PCTFE resins, ethylene-CTFE resins, TFE-perfluorodimethyldioxole copolymer resins, PVF resins, ABS resins, AS resins, acrylic resins, cellulose resins, polyamides, polyacetals, polycarbonates, polyphenylene ethers, polybutylene terephthalates, polyethylene terephthalates, cyclic polyolefins, polyphenylene sulfides, polysulfones, polyether sulfone resins, polybenzimidazole resins, polyarylate resins, polyether ketone resins, and polyamideimide resins; and natural resins such as natural rubbers. Among others, preferred are PTFE resins, PFA resins, FEP resins, ethylene-TFE copolymer resins, PVDF resins, PCTFE resins, ethylene-CTFE resins, TFE-perfluorodimethyldioxole copolymer resins, PVF resins, polyether sulfone resins, polyimide resins, polyester resins, polybenzimidazole resins, polyphenylene ether resins, polyamideimide resins, and polyether ketone resins, more preferably PFA resins, TFE-perfluorodimethyldioxole copolymer resins, PVF resins, polyether sulfone resins, polyimide resins, polyester resins, polybenzimidazole resins, polyphenylene ether resins, polyamideimide resins, and polyether ketone resins, especially preferably polyether sulfone resins, polyimide resins, polyester resins, polybenzimidazole resins, polyamideimide resins, polyphenylene ether resins, and polyether ketone resins.

Preferably, the binder is a thermoplastic resin, especially preferably at least one thermoplastic resin selected from polyether sulfone resins, polyimide resins, polyester resins, polybenzimidazole resins, polyphenylene ether resins, polyamideimide resins and polyether ketone resins.

The first release layer according to the present invention typically has a solvent solubility lower than that of the second release layer. The first release layer according to the present invention is preferably dissolved in at least one of the specific solvents mentioned above at 25° C. after curing at a concentration (% by mass) lower than that of the second release layer by 5 to 15% by mass. Further, the resin 1 is preferably dissolved in at least one of the specific solvents mentioned above at a concentration (% by mass) of 1 to 50% by mass at 25° C.

The amount of the binder contained in the first release layer of the present invention is preferably 1 to 100% by mass, more preferably 70 to 100% by mass, especially preferably 90 to 100% by mass based on the total solids (excluding the solvent) of the first release layer of the present invention.

The binder used in the first release layer may be used alone or as a combination of two or more.

<<<Solvent>>>

In the present invention, a solvent is typically used to form the first release layer. Any known solvents that can form the first release layer can be used without limitation, including N-methyl-2-pyrrolidone, N,N-dimethylacetamide, 2-butanone, methyl amyl ketone, anisole, xylene and the like, preferably N-methyl-2-pyrrolidone, N,N-dimethylacetamide, methyl amyl ketone or anisole.

The solvents are preferably used in such an amount that the solids content of the first release layer composition for forming the first release layer is 5 to 40% by mass.

The solvents used in the first release layer may be used alone or as a combination of two or more of them.

<<<Other Additives>>>

The first release layer composition may optionally contain various additives.

The first release layer composition of the present invention may contain various surfactants to further improve coatability. Surfactants that can be used include various surfactants such as fluorosurfactant, nonionic surfactants, cationic surfactants, anionic surfactants, silicone surfactants and the like.

Especially when the first release layer composition of the present invention used for the first release layer contains a fluorosurfactant, the liquid properties (especially flowability) of the coating solution prepared therefrom are further improved so that the uniformity of the coating thickness and coating consumption reduction can be further improved.

In other words, when a coating solution prepared from the first release layer composition containing a fluorosurfactant is used to form a film, interfacial tension between the substrate surface and the coating solution decreases, whereby wettability on the substrate surface and coatability on the substrate surface are improved. Thus, such embodiments are effective because a film of an even and uniform thickness can be formed more suitably even if it is formed in a small thickness in the order of several micrometers by using a small amount of the coating solution.

The fluorine content in the fluorosurfactant is preferably 3% by mass to 40% by mass, more preferably 5% by mass to 30% by mass, especially preferably 7% by mass to 25% by mass. Fluorosurfactants having a fluorine content in the ranges indicated above are effective for obtaining coated films having a uniform thickness and for reducing coating consumption, and they are also well soluble in the first release layer composition.

Fluorosurfactants include, for example, Megaface F171, F172, F173, F176, F177, F141, F142, F143, F144, R30, F437, F475, F479, F482, F554, F780, and F781 (all from DIC Corporation); Fluorad FC430, FC431, and FC171 (all from Sumitomo 3M Limited); SURFLON S-382, SC-101, SC-103, SC-104, SC-105, SC1068, SC-381, SC-383, S393, and KH-40 (all from ASAHI GLASS CO., LTD.); PF636, PF656, PF6320, PF6520, and PF7002 (from OMNOVA) and the like.

Nonionic surfactants specifically include glycerol, trimethylolpropane, trimethylolethane as well as ethoxylates and propoxylates thereof (e.g., glycerol propoxylate, glycerol ethoxylate and the like); polyoxyethylene lauryl ether, polyoxyethylene stearyl ether, polyoxyethylene oleyl ether, polyoxyethylene octylphenyl ether, polyoxyethylene nonylphenyl ether, polyethylene glycol dilaurate, polyethylene glycol distearate, sorbitan fatty acid esters (Pluronic L10, L31, L61, L62, 10R5, 17R2 and 25R2, and Tetronic 304, 701, 704, 901, 904 and 150R1 from BASF; Solsperse 20000 from Lubrizol Japan Limited) and the like.

Cationic surfactants specifically include phthalocyanine derivatives (available from Morishita Sangyo K.K. under the brand name EFKA-745); the organosiloxane polymer KP341 (from Shin-Etsu Chemical Co., Ltd.); the (meth)acrylic (co)polymers POLYFLOW No. 75, No. 90, and No. 95 (from Kyoeisha Chemical Co., Ltd.); W001 (from Yusho Co., Ltd.); and the like.

Anionic surfactants specifically include W004, W005 and W017 (from Yusho Co., Ltd.) and the like.

Silicone surfactants include, for example, "Toray Silicone DC3PA", "Toray Silicone SH7PA", "Toray Silicone DC11PA", "Toray Silicone SH21PA", "Toray Silicone SH28PA", "Toray Silicone SH29PA", "Toray Silicone SH30PA", and "Toray Silicone SH8400" from Dow Corning Toray Co., Ltd.; "TSF-4440", "TSF-4300", "TSF-4445", "TSF-4460", and "TSF-4452" from Momentive Performance Materials Inc.; "KP341", "KF6001", and "KF6002" from Shin-Etsu Silicone, Co., Ltd.; "BYK307", "BYK323", and "BYK330" from BYK Japan KK; and the like.

The surfactants may be used alone or as a combination of two or more of them.

The amount of the surfactants to be added is preferably 0.001% by mass to 2.0% by mass, more preferably 0.005% by mass to 1.0% by mass based on the total solids of the first release layer composition.

The method for forming the first release layer of the temporary bonding laminates for used in a manufacture of semiconductor devices according to the present invention is not specifically limited, but can be suitably accomplished by appropriately changing the types and amounts of binders described above as preferred examples, i.e., by using a binder selected from the preferred specific examples indicated above at a more preferred concentration.

<<Second Release Layer>>

The second release layer (a2) according to the present invention is characterized in that it contains a resin capable of being dissolved at 5% by mass or more in at least one of solvents selected from hexane, heptane, ethyl acetate, acetone, methanol, ethanol, isopropanol, 1,4-dioxane, tetrahydrofuran, 1-methoxy-2-propanol, 2-acetoxy-1-methoxypropane, acetonitrile, methyl ethyl ketone, cyclohexanone, toluene, dimethyl sulfoxide, N,N-dimethylformamide, N,N-dimethylacetamide, N-methyl-2-pyrrolidinone, N-ethyl-2-pyrrolidinone, chloroform, methylene chloride, anisole, xylene, and mesitylene at 25° C. after curing and adjoins the first release layer (a1). Thus, the second release layer is used for the purpose of improving the removal of residues of the first release layer from the processed member with a solvent.

Therefore, the second release layer must contain a resin capable of being dissolved in solvents after curing. More preferably, the solvent-soluble resin according to the present invention is a resin capable of being dissolved at 10% by mass or more in at least one of the solvents mentioned above at 25° C. In such embodiments, the removal of the first release layer can be rapidly completed. Especially, it should be noted that if the release layer solely consists of the first release layer according to the present invention containing a binder having a high softening point, it would take a long time to remove it with a solvent because of high cohesion typical of materials having a high softening point.

Further, the resin contained in the second release layer according to the present invention should be solvent-soluble after curing, but may or may not be solvent-soluble before curing.

<<<Resin>>>

Resins that may be contained in the second release layer are not specifically limited so far as they meet the requirements described above, but include, for example, synthetic resins such as terpene resins, terpene phenol resins, modified terpene resins, hydrogenated terpene resins, hydrogenated terpene phenol resins, rosins, rosin esters, hydrogenated rosins, hydrogenated rosin esters, polymerized rosins, polymerized rosin esters, modified rosins, rosin-modified phenolic resins, alkyl phenolic resins, aliphatic petroleum resins, aromatic petroleum resins, hydrogenated petroleum resins, modified petroleum resins, alicyclic petroleum resins, coumarone petroleum resins, indene petroleum resins, olefin copolymers (e.g., methylpentene copolymers), cycloolefin copolymers (e.g., norbornene copolymers, dicyclopentadiene copolymers, tetracyclododecene copolymers), unsaturated polyester resins, alkyd resins, polyurethane resins, polyimide resins, polyethylene resins, polypropylene resins, polyvinyl chloride resins, polystyrene resins, polystyrene-polymethyl methacrylate resins, polyvinyl acetate resins, ABS resins, AS resins, acrylic resins, modified cellulose resins, polyamides, polyacetals, polycarbonates, polyphenylene ethers, polybutylene terephthalates, polyethylene terephthalates, cyclic polyolefins, polysulfones, and polyether sulfone resins; and natural resins such as natural rubbers.

Among others, preferred are terpene resins, terpene phenol resins, modified terpene resins, hydrogenated terpene resins, hydrogenated terpene phenol resins, rosins, rosin esters, hydrogenated rosins, hydrogenated rosin esters, polymerized rosins, polymerized rosin esters, modified rosins, rosin-modified phenolic resins, alkyl phenolic resins, aliphatic petroleum resins, aromatic petroleum resins, hydrogenated petroleum resins, modified petroleum resins, alicyclic petroleum resins, coumarone petroleum resins, indene petroleum resins, olefin copolymers, cycloolefin copolymers, polystyrene resins, polystyrene-polymethyl methacrylate resins, modified cellulose resins, and polycarbonates, more preferably hydrogenated terpene resins, cycloolefin copolymers, polystyrene resins, polystyrene-polymethyl methacrylate resins, and polycarbonates.

The second release layer according to the present invention typically has a softening point lower than the softening point of the first release layer. The softening point of the second release layer according to the present invention is preferably lower than the softening point of the first release layer by 20° C. or more, more preferably 50° C. or more.

The amount of the binder contained in the second release layer of the present invention is preferably 1 to 100% by mass, more preferably 70 to 100% by mass, especially preferably 90 to 100% by mass based on the total solids (excluding the solvent) of the second release layer of the present invention.

The resin used in the second release layer may be used alone or as a combination of two or more.

<<<Solvent>>>

In the present invention, a solvent is typically used to form the second release layer. Any known solvents that can form the second release layer can be used without limitation, including N-methyl-2-pyrrolidone, N,N-dimethylacetamide, 2-butanone, methyl amyl ketone, anisole, xylene, THF and the like, preferably N-methyl-2-pyrrolidone, N,N-dimethylacetamide, methyl amyl ketone, anisole or THF.

The solvents are preferably used in such an amount that the solids content of the second release layer composition is 5 to 40% by mass.

The solvents used in the second release layer may be used alone or as a combination of two or more of them.

<<<Other Additives>>>

The second release layer composition may optionally contain various additives. Specifically, they preferably include those described for the first release layer.

<(B) Adhesive Layer>

The adhesive layer is used for the purpose of bonding the release layer and the substrate. Therefore, the adhesive layer should have adhesiveness less influenced by heat/chemicals.

The adhesive layer can be formed by coating an adhesive composition containing various components described later on a carrier substrate using a known technique such as spin coating, spray coating, roller coating, flow coating, blade coating, dip coating or the like, and then drying it.

Further, the adhesive layer may be a layer having an adhesiveness that increases or decreases by irradiation with active rays or radiation or a layer having two or more regions of different bond strengths obtained by exposing the surface of a layer having an adhesiveness that increases or decreases by irradiation with active rays or radiation.

Exposure is preferably pattern exposure using a mask, specifically as described later.

The thickness of the adhesive layer is, for example, in the range of 1 to 500 µm, but not specifically limited.

<<Binder>>

Preferably, the adhesive composition (therefore, the adhesive layer) contains a binder.

In the present invention, any binders can be used. For example, they include synthetic resins such as hydrocarbon resins, novolac resins, phenolic resins, epoxy resins, melamine resins, urea resins, unsaturated polyester resins, alkyd resins, polyurethanes, polyimides, polyethylenes, polypropylenes, polyvinyl chlorides, polystyrenes, styrene-methyl methacrylate copolymer resins, polyvinyl acetates, Teflons (registered trademark), ABS resins, AS resins, acrylic resins, polyamides, polyacetals, polycarbonates, polyphenylene ethers, polybutylene terephthalates, polyethylene terephthalates, cyclic polyolefins, polyphenylene sulfides, polysulfones, polyether sulfones, polyarylates, polyether ether ketones, and polyamideimides; and natural resins such as natural rubbers. Among others, preferred are polyurethanes, novolac resins, polyimides, polystyrenes, and styrene-methyl methacrylate copolymer resins, more preferably novolac resins, polyimides, polystyrenes, and styrene-methyl methacrylate copolymer resins, especially preferably polyimides, polystyrenes, and styrene-methyl methacrylate copolymer resins.

The binder used in the adhesive composition may be used alone or as a combination of two or more.

In the present invention, any hydrocarbon resins can be used.

As used herein, the hydrocarbon resin basically refers to a resin solely consisting of carbon atoms and hydrogen atoms, but it may contain other atoms in the side chain so far as its basic skeleton is a hydrocarbon resin. Further, the hydrocarbon resin as used herein does not include a resin in which a non-hydrocarbon functional group is directly attached to the main chain, such as acrylic resins, polyvinyl alcohol resins, polyvinyl acetal resins, and polyvinyl pyrrolidone resins.

Hydrocarbon resins satisfying the criteria described above include, for example, polystyrene resins, terpene resins, terpene phenol resins, modified terpene resins, hydrogenated terpene resins, hydrogenated terpene phenol resins, rosins, rosin esters, hydrogenated rosins, hydrogenated rosin esters, polymerized rosins, polymerized rosin esters, modified rosins, rosin-modified phenolic resins, alkyl phenolic resins, aliphatic petroleum resins, aromatic petroleum resins, hydrogenated petroleum resins, modified petroleum resins, alicyclic petroleum resins, coumarone petroleum resins, indene petroleum resins, olefin polymers (e.g., methylpentene copolymers), cycloolefin polymers (e.g., norbornene copolymers, dicyclopentadiene copolymers, tetraclyclododecene copolymers) and the like.

Among others, preferred are polystyrene resins, terpene resins, rosins, petroleum resins, hydrogenated rosins, polymerized rosins, olefin polymers, and cycloolefin polymers, more preferably polystyrene resins, terpene resins, rosins, olefin polymers, and cycloolefin polymers, even more preferably polystyrene resins, terpene resins, rosins, olefin polymers, polystyrene resins, and cycloolefin polymers, especially preferably polystyrene resins, terpene resins, rosins, cycloolefin polymers, and olefin polymers, most preferably polystyrene resins or cycloolefin polymers.

Examples of cyclic olefin resins used for preparing cycloolefin copolymers include norbornene polymers, monocyclic olefin polymers, cyclic conjugated diene polymers, vinyl alicyclic hydrocarbon polymers, and hydrides of these polymers and the like. Preferred examples include addition (co)polymerized cyclic olefin resins containing at least one or more repeat units represented by general formula (II) below, and those addition (co)polymerized cyclic olefin resins further containing at least one or more repeat units represented by general formula (I) as appropriate. Further, other preferred examples include ring-opened (co)polymers containing at least one cyclic repeat unit represented by general formula (III).

Formula 1

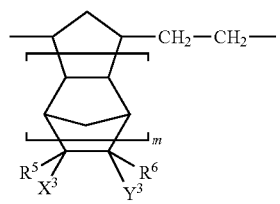

Formula (III)

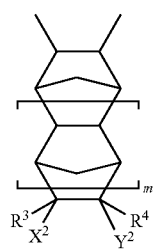

Formula (II)

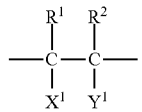

Formula (I)

In the formulae above, m represents an integer of 0 to 4. $R^1$ to $R^6$ each independently represent a hydrogen atom or a hydrocarbon group containing 1 to 10 carbon atoms, and $X^1$ to $X^3$ and $Y^1$ to $Y^3$ each independently represent a hydrogen atom, a hydrocarbon group containing 1 to 10 carbon atoms, a halogen atom, a hydrocarbon group containing 1 to 10 carbon atoms substituted by a halogen atom, $-(CH_2)nCOOR^{11}$, $-(CH_2)nOCOR^{12}$, $-(CH_2)nNCO$, $-(CH_2)nNO_2$, $-(CH_2)nCN$, $-(CH_2)nCONR^{13}R^{14}$, $-(CH_2)nNR^{13}R^{14}$, $-(CH_2)nOZ$, or $-(CH_2)nW$, or $X^1$ and $Y^1$, $X^2$ and $Y^2$, or $X^3$ and $Y^3$ are joined to form $(-CO)_2O$ or $(-CO)_2NR^{15}$ wherein $R^{11}$, $R^{12}$, $R^{13}$, $R^{14}$ and $R^{15}$ each independently represent a hydrogen atom or a hydrocarbon group containing 1 to 20 carbon atoms, Z represents a hydrocarbon group or a hydrocarbon group substituted by a halogen atom, and W represents $SiR^{16}{}_pD_{3-p}$ (wherein $R^{16}$ represents a hydrocarbon group containing 1 to 10 carbon atoms, D represents a halogen atom, $-OCOR^{16}$ or $-OR^{16}$, and p represents an integer of 0 to 3). n represents an integer of 0 to 10.

Norbornene addition (co)polymers are disclosed in JPA-H10-7732, JPA2002-504184, US2004/229157A1 or WO2004/070463A1 or the like. They are obtained by addition polymerization of norbornene polycyclic unsaturated compounds. Alternatively, they are obtained by addition polymerization of a norbornene polycyclic unsaturated compound with ethylene, propylene, butene; or a conjugated diene such as butadiene or isoprene; or a non-conjugated diene such as ethylidene norbornene. Such norbornene addition (co)polymers are commercially available from Mitsui Chemicals, inc. under the brand name APEL, including grades of different glass transition temperatures (Tg) such as APL8008T (Tg 70° C.), APL6013T (Tg 125° C.) or APL6015T (Tg 145° C.). Pellets are commercially available from Polyplastics Co., Ltd. under the brand names TOPAS 8007, 5013, 6013, 6015 and the like. Another commercial product is Appear 3000 available from Ferrania.

Norbornene polymer hydrides can be prepared by addition polymerization or ring-opening metathesis polymerization of polycyclic unsaturated compounds followed by hydrogenation as disclosed in JPA-H1-240517, JPA-H7-196736, JPA-S60-26024, JPA-S62-19801, JPA2003-1159767 or JPA2004-309979 or the like. In the formulae above, $R^5$ to $R^6$ preferably represent a hydrogen atom or $-CH_3$, $X^3$ and $Y^3$ preferably represent a hydrogen atom, and the other groups are appropriately selected. Such norbornene resins are commercially available from JSR Corporation under the brand name Arton G or Arton F, and also from Zeon Corporation under the brand names ZEONOR ZF14 and ZF16, and ZEONEX 250, 280 and 480R, and these products can be used.

The amount of the binder is preferably 30 to 80% by mass, more preferably 40 to 60% by mass based on the total solids of the adhesive composition.

<<Polymerizable Monomer>>

In the present invention, any polymerizable monomers can be used in the adhesive composition (therefore, the adhesive layer). The polymerizable monomer here contains a polymerizable group. The polymerizable group is a group that can be polymerized typically by irradiation with active rays or radiation or by the action of free radicals or an acid. It should be noted that the polymerizable monomer is a compound distinguished from the binder described above. The polymerizable monomer is typically a low molecular weight compound, preferably a low molecular weight compound having a molecular weight of 2000 or less, more preferably a low molecular weight compound having a molecular weight of 1500 or less, even more preferably a low molecular weight compound having a molecular weight of 900 or less. Typically, the low molecular weight compound has a molecular weight of 100 or more.

Preferably, the polymerizable group is, for example, a functional group capable of participating in an addition polymerization reaction, and such functional groups capable of participating in an addition polymerization reaction include ethylenically unsaturated bond-containing groups, amino, epoxy and the like. The polymerizable group may also be a functional group capable of generating free radicals when photoirradiated, and such polymerizable groups include, for example, thiol, halogens and the like. Among others, preferred polymerizable groups are ethylenically unsaturated bond-containing groups. Ethylenically unsaturated bond-containing groups preferably include styryl, (meth)acryloyl, and allyl.

Reactive compounds containing a polymerizable group specifically include (B1) radically polymerizable compounds and (B2) ionically polymerizable compounds.
Radically polymerizable compounds include (B11) (meth) acrylamide compounds containing 3 to 35 carbon atoms, (B12) (meth)acrylate compounds containing 4 to 35 carbon atoms, (B13) aromatic vinyl compounds containing 6 to 35 carbon atoms, (B14) vinyl ether compounds containing 3 to 20 carbon atoms, and (B15) other radically polymerizable compounds and the like. The radically polymerizable compounds (B1) may be used alone or as a combination of two or more of them.

Further, polymerization inhibitors such as hydroquinones, methyl ether hydroquinones and the like may also be used, as appropriate.

(Meth)acrylamide compounds containing 3 to 35 carbon atoms (B11) include, for example, (meth)acrylamide, N-methyl (meth)acrylamide, N-ethyl (meth)acrylamide, N-propyl (meth)acrylamide, N-n-butyl (meth)acrylamide, N-tert-butyl (meth)acrylamide, N-butoxymethyl (meth) acrylamide, N-isopropyl (meth)acrylamide, N-methylol (meth)acrylamide, N,N-dimethyl (meth)acrylamide, N,N-diethyl (meth)acrylamide and (meth)acryloylmorpholine.

(Meth)acrylate compounds containing 4 to 35 carbon atoms (B12) include, for example, the monofunctional to hexafunctional (meth)acrylates mentioned below.

Monofunctional (meth)acrylates include ethyl (meth) acrylate, hexyl (meth)acrylate, 2-ethylhexyl (meth)acrylate, tert-octyl (meth)acrylate, isoamyl (meth)acrylate, decyl (meth)acrylate, isodecyl (meth)acrylate, stearyl (meth)acrylate, isostearyl (meth)acrylate, cyclohexyl (meth)acrylate, 4-n-butylcyclohexl (meth)acrylate, bornyl (meth)acrylate, isobornyl (meth)acrylate, benzyl (meth)acrylate, 2-ethylhexyldiglycol (meth)acrylate, butoxyethyl (meth)acrylate, 2-chloroethyl (meth)acrylate, 4-bromobutyl (meth)acrylate, cyanoethyl (meth)acrylate, benzyl (meth)acrylate, butoxymethyl (meth)acrylate, methoxypropylene monoacrylate, 3-methoxybutyl (meth)acrylate, alkoxymethyl (meth)acrylate, 2-ethylhexyl carbitol (meth)acrylate, alkoxyethyl (meth)acrylate, 2-(2-methoxyethoxy)ethyl (meth)acrylate, 2-(2-butoxyethoxy)ethyl (meth)acrylate, 2,2,2-tetrafluoroethyl (meth)acrylate, 1H,1H,2H,2H-perfluorodecyl (meth) acrylate, 4-butylphenyl (meth)acrylate, phenyl (meth)acrylate, 2,4,5-tetramethylphenyl (meth)acrylate, 4-chlorophenyl (meth)acrylate, phenoxymethyl (meth)acrylate, phenoxyethyl (meth)acrylate, glycidyl (meth)acrylate, glycidyloxybutyl (meth)acrylate, glycidyloxyethyl (meth) acrylate, glycidyloxypropyl (meth)acrylate, diethylene glycol monovinyl ether monoacrylate, tetrahydrofurfuryl (meth)acrylate, hydroxyalkyl (meth)acrylate, 2-hydroxyethyl (meth)acrylate, 3-hydroxypropyl (meth)acrylate, 2-hydroxypropyl (meth)acrylate, 2-hydroxybutyl (meth)acrylate, 4-hydroxybutyl (meth)acrylate, dimethylaminoethyl (meth) acrylate, diethylaminoethyl (meth)acrylate, dimethylaminopropyl (meth)acrylate, diethylaminopropyl (meth)acrylate, trimethoxysilylpropyl (meth)acrylate, trimethoxysilylpropyl (meth)acrylate, trimethylsilylpropyl (meth)acrylate, poly (ethylene oxide) monomethyl ether (meth)acrylate, oligo (ethylene oxide) monomethyl ether (meth)acrylate, poly (ethylene oxide) (meth)acrylate, oligo(ethylene oxide) (meth)acrylate, oligo(ethylene oxide) monoalkyl ether (meth)acrylate, poly(ethylene oxide) monoalkyl ether (meth)acrylate, dipropylene glycol (meth)acrylate, poly (propylene oxide) monoalkyl ether (meth)acrylate, oligo (propylene oxide) monoalkyl ether (meth)acrylate, 2-methacryloyloxyethylsuccinic acid, 2-methacryloyloxyhexahydrophthalic acid, 2-methacryloyloxyethyl-2-hydroxypropyl phthalate, butoxydiethylene glycol (meth)acrylate, trifluoroethyl (meth)acrylate, perfluorooctylethyl (meth)acrylate, 2-hydroxy-3-phenoxypropyl (meth)acrylate, EO-modified phenol (meth)acrylate, EO-modified cresol (meth)acrylate, EO-modified nonylphenol (meth)acrylate, PO-modified nonylphenol (meth)acrylate and EO-modified 2-ethylhexyl (meth)acrylate and the like. As used hereinbefore and hereinafter, EO means ethylene oxide, and PO means propylene oxide.

Bifunctional (meth)acrylates include 1,4-butane di(meth) acrylate, 1,6-hexane diacrylate, polypropylene diacrylate, 1,6-hexanediol di(meth)acrylate, 1,10-decanediol di(meth) acrylate, neopentyl diacrylate, neopentyl glycol di(meth) acrylate, 2,4-dimethyl-1,5-pentanediol di(meth)acrylate, butylethylpropanediol (meth)acrylate, ethoxylated cyclohexanemethanol di(meth)acrylate, polyethylene glycol di(meth)acrylate, oligoethylene glycol di(meth)acrylate, ethylene glycol di(meth)acrylate, 2-ethyl-2-butyl butanediol di(meth)acrylate, neopentyl glycol hydroxypivalate di(meth)acrylate, EO-modified bisphenol A di(meth)acrylate, bisphenol F polyethoxy di(meth)acrylate, polypropylene glycol di(meth)acrylate, oligopropylene glycol di(meth)acrylate, 1,4-butanediol di(meth)acrylate, 2-ethyl-2-butyl propanediol di(meth)acrylate, 1,9-nonane di(meth)acrylate, propoxylated ethoxylated bisphenol A di(meth)acrylate and tricyclodecane di(meth)acrylate and the like.

Trifunctional (meth)acrylates include trimethylolpropane tri(meth)acrylate, trimethylolethane tri(meth)acrylate, alkylene oxide modified tri(meth)acrylate of trimethylolpropane, pentaerythritol tri(meth)acrylate, dipentaerythritol tri(meth) acrylate, trimethylolpropane tri((meth)acryloyloxypropyl) ether, alkylene oxide modified isocyanurate tri(meth)acrylate, dipentaerythritol propionate tri(meth)acrylate, tri ((meth)acryloyloxyethyl) isocyanurate, hydroxypivalaldehyde modified dimethylolpropane tri(meth)acrylate, sorbitol tri(meth)acrylate, propoxylated trimethylolpropane tri (meth)acrylate and ethoxylated glycerol triacrylate and the like.

Tetrafunctional (meth)acrylates include pentaerythritol tetra(meth)acrylate, sorbitol tetra(meth)acrylate, ditrimethylolpropane tetra(meth)acrylate, dipentaerythritol propionate tetra(meth)acrylate and ethoxylated pentaerythritol tetra(meth)acrylate and the like.

Pentafunctional (meth)acrylates include sorbitol penta (meth)acrylate and dipentaerythritol penta(meth)acrylate.

Hexafunctional (meth)acrylates include dipentaerythritol hexa(meth)acrylate, sorbitol hexa(meth)acrylate, alkylene oxide modified hexa(meth)acrylate of phosphazene and caprolactone modified dipentaerythritol hexa(meth)acrylate and the like.

Aromatic vinyl compounds containing 6 to 35 carbon atoms (B13) include vinylthiophene, vinylfuran, vinylpyridine, styrene, methylstyrene, trimethylstyrene, ethylstyrene, isopropylstyrene, chloromethylstyrene, methoxystyrene, acetoxystyrene, chlorostyrene, dichlorostyrene, bromostyrene, methyl vinylbenzoate ester, 3-methylstyrene, 4-methylstyrene, 3-ethylstyrene, 4-ethylstyrene, 3-propylstyrene, 4-propylstyrene, 3-butylstyrene, 4-butylstyrene, 3-hexylstyrene, 4-hexylstyrene, 3-octylstyrene, 4-octylstyrene, 3-(2-ethylhexyl)styrene, 4-(2-ethylhexyl)styrene, allylstyrene, isopropenylstyrene, butenylstyrene, octenylstyrene, 4-tert-butoxycarbonylstyrene, 4-methoxystyrene and 4-tert-butoxystyrene and the like.

Vinyl ether compounds containing 3 to 35 carbon atoms (B14) include, for example, the following monofunctional or polyfunctional vinyl ethers.

Monofunctional vinyl ethers include, for example, methyl vinyl ether, ethyl vinyl ether, propyl vinyl ether, n-butyl vinyl ether, tert-butyl vinyl ether, 2-ethylhexyl vinyl ether, n-nonyl vinyl ether, lauryl vinyl ether, cyclohexyl vinyl ether, cyclohexylmethyl vinyl ether, 4-methylcyclohexylmethyl vinyl ether, benzyl vinyl ether, dicyclopentenyl vinyl ether, 2-dicyclopentenoxyethyl vinyl ether, methoxyethyl vinyl ether, ethoxyethyl vinyl ether, butoxyethyl vinyl ether, methoxyethoxyethyl vinyl ether, ethoxyethoxyethyl vinyl ether, methoxypolyethylene glycol vinyl ether, tetrahydrofurfuryl vinyl ether, 2-hydroxyethyl vinyl ether, 2-hydroxypropyl vinyl ether, 4-hydroxybutyl vinyl ether, 4-hydroxymethylcyclohexylmethyl vinyl ether, diethylene glycol monovinyl ether, polyethylene glycol vinyl ether, chloroethyl vinyl ether, chlorobutyl vinyl ether, chloroethoxyethyl vinyl ether, phenylethyl vinyl ether and phenoxypolyethylene glycol vinyl ether.

Polyfunctional vinyl ethers include, for example, divinyl ethers such as ethylene glycol divinyl ether, diethylene glycol divinyl ether, polyethylene glycol divinyl ether, propylene glycol divinyl ether, butylene glycol divinyl ether, hexanediol divinyl ether, bisphenol A alkylene oxide divinyl ether, bisphenol F alkylene oxide divinyl ether and the like; trimethylolethane trivinyl ether, trimethylolpropane trivinyl ether, ditrimethylolpropane tetravinyl ether, glycerol trivinyl ether, pentaerythritol tetravinyl ether, dipentaerythritol pentavinyl ether, dipentaerythritol hexavinyl ether, ethylene oxide modified trimethylolpropane trivinyl ether, propylene oxide modified trimethylolpropane trivinyl ether, ethylene oxide modified ditrimethylolpropane tetravinyl ether, propylene oxide modified ditrimethylolpropane tetravinyl ether, ethylene oxide modified pentaerythritol tetravinyl ether, propylene oxide modified pentaerythritol tetravinyl ether, ethylene oxide modified dipentaerythritol hexavinyl ether and propylene oxide modified dipentaerythritol hexavinyl ether.

Other radically polymerizable compounds (B15) include vinyl ester compounds (vinyl acetate, vinyl propionate and vinyl versatate and the like), allyl ester compounds (allyl acetate and the like), halogen-containing monomers (vinylidene chloride and vinyl chloride and the like) and olefin compounds (ethylene and propylene and the like) and the like.

Among them, (meth)acrylamide compounds (B11) and (meth)acrylate compounds (B12) are preferred, especially preferably (meth)acrylate compounds (B12) because of the rate of polymerization.

Ionically polymerizable compounds (B2) include (B21) epoxy compounds containing 3 to 20 carbon atoms and (B22) oxetane compounds containing 4 to 20 carbon atoms and the like.

Epoxy compounds containing 3 to 20 carbon atoms (B21) include, for example, the following monofunctional or polyfunctional epoxy compounds.

Monofunctional epoxy compounds include, for example, phenyl glycidyl ether, p-tert-butylphenyl glycidyl ether, butyl glycidyl ether, 2-ethylhexyl glycidyl ether, allyl glycidyl ether, 1,2-butylene oxide, 1,3-butadiene monoxide, 1,2-epoxydodecane, epichlorohydrin, 1,2-epoxydecane, styrene oxide, cyclohexene oxide, 3-methacryloyloxymethylcyclohexene oxide, 3-acryloyloxymethylcyclohexene oxide and 3-vinylcyclohexene oxide.

Polyfunctional epoxy compounds include, for example, bisphenol A diglycidyl ether, bisphenol F diglycidyl ether, bisphenol S diglycidyl ether, brominated bisphenol A diglycidyl ether, brominated bisphenol F diglycidyl ether, brominated bisphenol S diglycidyl ether, epoxy novolac resins, hydrogenated bisphenol A diglycidyl ether, hydrogenated bisphenol F diglycidyl ether, hydrogenated bisphenol S diglycidyl ether, 3,4-epoxycyclohexylmethyl 3',4'-epoxycyclohexanecarboxylate, 2-(3,4-epoxycyclohexyl-5,5-spiro-3,4-epoxy)cyclohexane-m-dioxane, bis(3,4-epoxycyclohexylmethyl) adipate, vinylcyclohexene oxide, 4-vinylepoxycyclohexane, bis(3,4-epoxy-6-methylcyclohexylmethyl) adipate, 3,4-epoxy-6-methylcyclohexyl-3',4'-epoxy-6'-methylcyclohexane carboxylate, methylenebis(3,4-epoxycyclohexane), dicyclopentadiene diepoxide, ethylene glycol di(3,4-epoxycyclohexylmethyl) ether, ethylenebis(3,4-epoxycyclohexane carboxylate), dioctyl epoxyhexahydrophthalate, di-2-ethylhexyl epoxyhexahydrophthalate, 1,4-butanediol diglycidyl ether, 1,6-hexanediol diglycidyl ether, glycerol triglycidyl ether, trimethylolpropane triglycidyl ether, polyethylene glycol diglycidyl ether, polypropylene glycol diglycidyl ethers, 1,1,3-tetradecadiene dioxide, limonene dioxide, 1,2,7,8-diepoxyoctane and 1,2,5,6-diepoxycyclooctane.

Among these epoxy compounds, aromaticepoxidesandalicyclic epoxides are preferred, especially preferably alicyclic epoxides because of the high rate of polymerization.

Oxetane compounds containing 4 to 20 carbon atoms (B22) include compounds containing 1 to 6 oxetane rings and the like.

Compounds containing one oxetane ring include, for example, 3-ethyl-3-hydroxymethyloxetane, 3-(meth)allyloxymethyl-3-ethyloxetane, (3-ethyl-3-oxetanylmethoxy)methylbenzene, 4-fluoro-[1-(3-ethyl-3-oxetanylmethoxy)methyl]benzene, 4-methoxy-[1-(3-ethyl-3-oxetanylmethoxy)methyl]benzene, [1-(3-ethyl-3-oxetanylmethoxy)ethyl]phenyl ether, isobutoxymethyl (3-ethyl-3-oxetanylmethyl) ether, isobornyloxyethyl (3-ethyl-3-oxetanylmethyl) ether, isobornyl (3-ethyl-3-oxetanylmethyl) ether, 2-ethylhexyl (3-ethyl-3-oxetanylmethyl) ether, ethyldiethylene glycol (3-ethyl-3-oxetanylmethyl) ether, dicyclopentadiene (3-ethyl-3-oxetanylmethyl) ether, dicyclopentenyloxyethyl (3-ethyl-3-oxetanylmethyl) ether, dicyclopentenyl (3-ethyl-3-oxetanylmethyl) ether, tetrahydrofurfuryl (3-ethyl-3-oxetanylmethyl) ether, tetrabromophenyl (3-ethyl-3-oxetanylmethyl) ether, 2-tetrabromophenoxyethyl (3-ethyl-3-oxetanylmethyl) ether, tribromophenyl (3-ethyl-3-oxetanylmethyl) ether, 2-tribromophenoxyethyl (3-ethyl-3-oxetanylmethyl) ether, 2-hydroxyethyl (3-ethyl-3-oxetanylmethyl) ether, 2-hydroxypropyl (3-ethyl-3-oxetanylmethyl) ether, butoxyethyl (3-ethyl-3-oxetanylmethyl) ether, pentachlorophenyl (3-ethyl-3-oxetanylmethyl) ether, pentabromophenyl (3-ethyl-3-oxetanylmethyl) ether and bornyl (3-ethyl-3-oxetanylmethyl) ether.

Compounds containing 2 to 6 oxetane rings include, for example, 3,7-bis(3-oxetanyl)-5-oxanonane, 3,3'-(1,3-(2-methylenyl)propanediylbis(oxymethylene))bis(3-et hyloxetane), 1,4-bis[(3-ethyl-3-oxetanylmethoxy)methyl]benzene, 1,2-bis[(3-ethyl-3-oxetanylmethoxy)methyl]ethane, 1,3-bis[(3-ethyl-3-oxetanylmethoxy)methyl]propane, ethylene glycol bis(3-ethyl-3-oxetanylmethyl) ether, dicyclopentenyl bis(3-ethyl-3-oxetanylmethyl) ether, triethylene glycol bis(3-ethyl-3-oxetanylmethyl) ether, tetraethylene glycol bis (3-ethyl-3-oxetanylmethyl) ether, tricyclodecanediyldimethylene (3-ethyl-3-oxetanylmethyl) ether, trimethylolpropane tris(3-ethyl-3-oxetanylmethyl) ether, 1,4-bis(3-ethyl-3-oxetanylmethoxy)butane, 1,6-bis(3-ethyl-3-oxetanylmethoxy) hexane, pentaerythritol tris(3-ethyl-3-oxetanylmethyl) ether, pentaerythritol tetrakis(3-ethyl-3-oxetanylmethyl) ether, polyethylene glycol bis(3-ethyl-3-oxetanylmethyl) ether, dipentaerythritol hexakis(3-ethyl-3-oxetanylmethyl) ether, dipentaerythritol pentakis(3-ethyl-3-oxetanylmethyl) ether, dipentaerythritol tetrakis(3-ethyl-3-oxetanylmethyl) ether, caprolactone modified dipentaerythritol hexakis(3-ethyl-3-oxetanylmethyl) ether, caprolactone modified dipentaerythritol pentakis(3-ethyl-3-oxetanylmethyl) ether, ditrimethylolpropane tetrakis(3-ethyl-3-oxetanylmethyl) ether, EO-modified bisphenol A bis(3-ethyl-3-oxetanylmethyl) ether, PO-modified bisphenol A bis(3-ethyl-3-oxetanylmethyl) ether, EO-modified hydrogenated bisphenol A bis(3-ethyl-3-oxetanylmethyl) ether, PO-modified hydrogenated bisphenol A bis(3-ethyl-3-oxetanylmethyl) ether and EO-modified bisphenol F (3-ethyl-3-oxetanylmethyl) ether.

The amount of the polymerizable monomer contained is preferably 5 to 75% by mass, more preferably 10 to 70% by mass, even more preferably 10 to 60% by mass based on the total solids of the adhesive layer to achieve good bond strength and releasability.

Further, the ratio between the contents of the polymerizable monomer and the binder (mass ratio) is preferably 90/10 to 10/90, more preferably 20/80 to 80/20.
The polymerizable monomer may be used alone or as a combination of two or more.
<<Solvent>>

Any known solvents that can form the adhesive layer can be used without limitation, including N-methyl-2-pyrrolidone, 2-butanone, methyl amyl ketone, limonene, PGMEA (1-methoxy-2-propyl acetate) and the like, preferably N-methyl-2-pyrrolidone, 2-butanone, methyl amyl ketone, limonene, or PGMEA (1-methoxy-2-propyl acetate).
The solvents are preferably used in such an amount that the solids content of the adhesive composition is 5 to 40% by mass.

The solvents may be used alone or as a combination of two or more of them.
<<Photoinitiator>>

The adhesive composition (therefore, the adhesive layer) preferably contains a photoinitiator, i.e., a compound capable of generating free radicals or an acid when irradiated with active rays or radiation.

The presence of a photoinitiator allows the adhesive composition to be cured by free radicals or an acid when the adhesive layer is photoirradiated, whereby adhesiveness in the photoirradiated region decreases. If the surface of the adhesive layer is irradiated through a photomask, for example, it would have the advantage that regions of different bond strengths can be easily prepared according to the pattern of the photomask.

Compounds capable of generating free radicals or an acid when irradiated with active rays or radiation that can be used include, for example, those known as photoinitiators described below.

The photoinitiator is not specifically limited so far as it has the ability to initiate a polymerization reaction (crosslinking reaction) in a high molecular weight compound containing a polymerizable group serving as the binder or in a reactive compound containing a polymerizable group serving as the polymerizable monomer, and it can be appropriately selected from known photoinitiators. For example, it is preferably sensitive to radiations from UV to visible regions. Further, it may be an activator capable of producing a reaction with a photoexcited sensitizer to generate active free radicals or an initiator capable of initiating cationic polymerization by generating an acid depending on the type of the monomer.

Further, the photoinitiator preferably contains at least one compound having a molar absorption coefficient of at least about 50 in the range of about 300 nm to 800 nm (preferably 330 nm to 500 nm).

Any of those known compounds can be used as the photoinitiator without limitation, including, for example, halogenated hydrocarbon derivatives (e.g., those containing a triazine skeleton, those containing an oxadiazole skeleton, those containing a trihalomethyl group, and the like), acyl phosphine compounds such as acyl phosphine oxide, hexaaryl biimidazole, oxime compounds such as oxime derivatives, organic peroxides, thio compounds, ketone compounds, aromatic onium salts, ketoxime ethers, aminoacetophenone compounds, hydroxyacetophenone, azo compounds, azide compounds, metallocene compounds, organoboron compounds, iron-arene complexes and the like.

The halogenated hydrocarbon compounds containing a triazine skeleton include, for example, the compounds described in Bull. Chem. Soc. Japan, 42, 2924 (1969) by Wakabayashi et al.; the compounds described in GB 1388492(A); the compounds described in JP-A-S53-133428; the compounds described in DE 3337024 A1; the compounds described in J. Org. Chem., 29, 1527 (1964) by F. C. Schaefer et al.; the compounds described in JP-A-S62-58241; the compounds described in JP-A-H5-281728; the compounds described in JP-A-H5-34920; the compounds described in U.S. Pat. No. 4,212,976 and the like.

The compounds described in U.S. Pat. No. 4,212,976 include, for example, compounds containing an oxadiazole skeleton (e.g., 2-trichloromethyl-5-phenyl-1,3,4-oxadiazole, 2-trichloromethyl-5-(4-chlorophenyl)-1,3,4-oxadiazole, 2-trichloromethyl-5-(1-naphthyl)-1,3,4-oxadiazole, 2-trichloromethyl-5-(2-naphthyl)-1,3,4-oxadiazole, 2-tribromomethyl-5-phenyl-1,3,4-oxadiazole, 2-tribromomethyl-5-(2-naphthyl)-1,3,4-oxadiazole, 2-trichloromethyl-5-styryl-1,3,4-oxadiazole, 2-trichloromethyl-5-(4-chlorostyryl)-1,3,4-oxadiazole, 2-trichloromethyl-5-(4-methoxystyryl)-1,3,4-oxadiazole, 2-trichloromethyl-5-(1-naphthyl)-1,3,4-oxadiazole, 2-trichloromethyl-5-(4-n-butoxystyryl)-1,3,4-oxadiazole, 2-tribromomethyl-5-styryl-1,3,4-oxadiazole, etc.), and the like.

Photoinitiators other than those described above include acridine derivatives (e.g., 9-phenylacridine, 1,7-bis(9,9'-acridinyl)heptane, etc.), N-phenylglycine and the like, polyhalogen compounds (e.g., carbon tetrabromide, phenyl tribromomethyl sulfone, phenyl trichloromethyl ketone, etc.), coumarins (e.g., 3-(2-benzofuranoyl)-7-diethylaminocoumarin, 3-(2-benzofuroyl)-7-(1-pyrrolidinyl)coumarin, 3-benzoyl-7-diethylaminocoumarin, 3-(2-methoxybenzoyl)-7-diethylaminocoumarin, 3-(4-dimethylaminobenzoyl)-7-diethylaminocoumarin, 3,3'-carbonylbis(5,7-di-n-propoxy-coumarin), 3,3'-carbonylbis(7-diethylaminocoumarin), 3-benzoyl-7-methoxycoumarin, 3-(2-furoyl)-7-diethylaminocoumarin, 3-(4-diethylaminocinnamoyl)-7-diethylaminocoumarin, 7-methoxy-3-(3-pyridylcarbonyl)coumarin, 3-benzoyl-5,7-dipropoxycoumarin, 7-benzotriazol-2-ylcoumarin, the coumarin compounds described in JP-A-H5-19475, JP-A-H7-271028, JP-A2002-363206, JP-A2002-363207, JP-A2002-363208, JP-A2002-363209 and the like, etc.), acyl phosphine oxides (e.g., bis(2,4,6-trimethylbenzoyl)phenylphosphine oxide, bis(2,6-dimethoxybenzoyl)-2,4,4-trimethylpentylphenylphosphin e oxide, Lucirin TPO, etc.), metallocenes (e.g., bis(η5-2,4-cyclopentadien-1-yl)bis(2,6-difluoro-3-(1H-pyrrole-1-yl)phenyl) titanium, (η5-cyclopentadienyl) (η6-cumenyl)iron (1+) hexafluorophosphate (1-), etc.), and the compounds described in JP-A-S53-133428, JP-B-S57-1819, JP-B-S57-6096 and U.S. Pat. No. 3,615,455, and the like.

The ketone compounds include, for example, benzophenone, 2-methylbenzophenone, 3-methylbenzophenone, 4-methylbenzophenone, 4-methoxybenzophenone, 2-chlorobenzophenone, 4-chlorobenzophenone, 4-bromobenzophenone, 2-carboxybenzophenone, 2-ethoxycarbonylbenzophenone, benzophenonetetracarboxylic acid or its tetramethyl ester, 4,4'-bis(dialkylamino)benzophenones (e.g., 4,4'-bis(dimethylamino)benzophenone, 4,4'-bis(dicyclohexylamino)benzophenone, 4,4'-bis(diethylamino)benzophenone, 4,4'-bis(dihydroxyethylamino)benzophenone, 4-methoxy-4'-dimethylaminobenzophenone, 4,4'-dimethoxybenzophenone, and 4-dimethylaminobenzophenone), 4-dimethylaminoacetophenone, benzil, anthraquinone, 2-tert-butylanthraquinone, 2-methylanthraquinone, phenanthraquinone, xanthone, thioxanthone, 2-chlorothioxanthone, 2,4-diethylthioxanthone, fluorenone, 2-benzyldimethylamino-1-(4-morpholinophenyl)-1-butanone, 2-methyl-1-[4-(methylthio)phenyl]-2-morpholino-1-propanone, 2-hydroxy-2-methyl-[4-(1-methylvinyl)phenyl]propanol oligomers, benzoin, benzoin ethers (e.g., benzoin methyl ether, benzoin ethyl ether, benzoin propyl ether, benzoin isopropyl ether, benzoin phenyl ether, and benzil dimethyl ketal), acridone, chloroacridone, N-methylacridone, N-butylacridone, N-butylchloroacridone, etc.

Other photoinitiators that can be suitably used include hydroxyacetophenone compounds, aminoacetophenone compounds, and acylphosphine compounds. More specifically, the aminoacetophenone initiators described in JP-A-H10-291969 and the acylphosphine oxide initiators described in Japanese Patent No. 4225898 can also be used, for example.

Hydroxyacetophenone initiators that can be used include IRGACURE-184, DAROCUR-1173, IRGACURE-500, IRGACURE-2959 and IRGACURE-127 (all brand names from BASF). Aminoacetophenone initiators that can be used include commercially available products IRGACURE-907, IRGACURE-369, and IRGACURE-379 (all brand names from BASF). Other aminoacetophenone initiators that can be used include the compounds having an absorption wavelength matched to a source of long wave radiation such as 365 nm or 405 nm described in JP-A2009-191179. Acylphosphine initiators that can be used include commercially available products IRGACURE-819 and DAROCUR-TPO (both brand names from BASF).

Photoinitiators more preferably include oxime compounds. Specific examples of oxime initiators that can be used include the compounds described in JP-A2001-233842, the compounds described in JP-A2000-80068, and the compounds described in JP-A2006-342166.

Oxime compounds such as oxime derivatives suitably used as photoinitiators in the present invention include, for example, 3-benzoyloxyiminobutan-2-one, 3-acetoxyiminobutan-2-one, 3-propionyloxyiminobutan-2-one, 2-acetoxyiminopentan-3-one, 2-acetoxyimino-1-phenylpropan-1-one, 2-benzoyloxyimino-1-phenylpropan-1-one, 3-(4-toluenesulfonyloxy)iminobutan-2-one, and 2-ethoxycarbonyloxyimino-1-phenylpropan-1-one and the like.

Oxime ester compounds include the compounds described in J. C. S. Perkin II (1979) pp. 1653-1660, J. C. S. Perkin II (1979) pp. 156-162, Journal of Photopolymer Science and Technology (1995) pp. 202-232 and JP-A2000-66385; the compounds described in JP-A2000-80068, JP-A2004-534797, and JP-A2006-342166 and the like. Commercially available products such as IRGACURE-OXE01 (from BASF) and IRGACURE-OXE02 (from BASF) can also be suitably used.

Oxime ester compounds other than those described above that may be used include the compounds containing an oxime moiety substituted on the nitrogen atom of a carbazole described in JP-A2009-519904; the compounds containing a hetero substituent on the benzophenone moiety described in U.S. Pat. No. 7,626,957; the compounds containing a nitro group on the dye moiety described in JP-A2010-15025 and US Patent Application Publication No. 2009/292039; the ketoxime compounds described in WO2009/131189; the compounds containing a triazine skeleton and an oxime skeleton in the same molecule described in U.S. Pat. No. 7,556,910; the compounds having a maximum absorption at 405 nm and also having good sensitivity to g-line sources described in JP-A2009-221114; and the like.

Preferably, the cyclic oxime compounds described in JP-A2007-231000 and JP-A2007-322744 can also be suitably used. Among cyclic oxime compounds, the cyclic oxime compounds annulated with a carbazole dye described in JP-A2010-32985 and JP-A2010-185072 are especially preferred because of high absorptivity leading to high sensitivity.

Further, the oxime compounds containing an unsaturated bond at a specific site described in JP-A2009-242469 can also be suitably used because they can regenerate active free radicals from polymerization-inactive free radicals to achieve high sensitivity.

Most preferred are the oxime compounds containing a specific substituent shown in JP-A2007-269779 and the oxime compounds containing a thioaryl group shown in JP-A2009-191061.

The molar absorption coefficient of a compound can be determined by known methods, and specifically, it is preferably determined at a concentration of 0.01 g/L in ethyl acetate as a solvent by using an ultraviolet-visible spectrophotometer (Carry-5 spectrophotometer from Varian), for example.

The photoinitiators used in the present invention may be used as a combination of two or more of them, if desired.

The amount of the photoinitiators contained in the adhesive composition used in the present invention is preferably 0.01 to 50% by mass, more preferably 0.1 to 20% by mass, most preferably 0.5 to 10% by mass based on the total solids of the adhesive composition.

<<Thermal Polymerization Initiator>>

Preferably, the adhesive composition (therefore, the adhesive layer) of the present invention also contains a thermal polymerization initiator, i.e., a compound capable of generating free radicals or an acid when heated.

Especially when it comprises a high molecular weight compound containing a polymerizable group as the binder or the polymerizable monomer, it preferably contains a thermal polymerization initiator.

The presence of a thermal polymerization initiator has the advantage that a more heat resistant and chemical resistant bond can be formed by heating the adhesive layer at or higher than the decomposition temperature of the thermal polymerization initiator to cure it after the adhesive layer and the release layer have been bonded.

<<<Compounds Capable of Generating Free Radicals when Heated>>>

Compounds capable of generating free radicals when heated (hereinafter also simply referred to as "thermal free radical generator") that can be used include known thermal free radical generators.

The thermal free radical generator is a compound capable of generating free radicals by thermal energy to initiate or promote a polymerization reaction of a high molecular weight compound containing a polymerizable group and a polymerizable monomer. If an adhesive layer formed by using an adhesive composition containing a thermal free radical generator is irradiated with heat and then a member to be processed and an adhesive support are temporarily bonded, a crosslinking reaction proceeds by heat in a reactive compound containing a crosslinkable group, whereby the adhesiveness (i.e., stickiness and tackiness) of the adhesive layer can be decreased in advance as described later.

If a member to be processed and an adhesive support are temporarily bonded and then the adhesive layer in the adhesive support is irradiated with heat, on the other hand, a crosslinking reaction proceeds by heat in a reactive compound containing a crosslinkable group, whereby the adhesive layer is strengthened enough to prevent the adhesive layer from cohesive failure that would be likely to occur during a mechanical or chemical process of the member to be processed. Thus, the adhesiveness of the adhesive layer can be improved.

Preferred thermal free radical generators include the compounds capable of generating an acid or free radicals when irradiated with active rays or radiation described above, among which compounds having a thermal decomposition point in the range of 130° C. to 250° C., preferably 150° C. to 220° C. can be preferably used.

Thermal free radical generators include aromatic ketones, onium salt compounds, organic peroxides, thio compounds, hexaaryl biimidazole compounds, ketoxime ester compounds, borate compounds, azinium compounds, metallocene compounds, active ester compounds, compounds containing a carbon-halogen bond, azo compounds and the like. Among others, more preferred are organic peroxides or azo compounds, especially preferably organic peroxides. Specifically, the compounds described in paragraphs 0074 to 0118 of JPA2008-63554 are included.

Preferably, the adhesive layer comprises a binder, a polymerizable monomer, and at least one of a photoinitiator and a thermal polymerization initiator, more preferably a photoinitiator.

When the adhesive composition (therefore, the adhesive layer) according to the present invention further comprises a radically polymerizable monomer especially in combination with a photoinitiator or a thermal polymerization initiator, the adhesive layer 11 can be an adhesive layer having adhesiveness that decreases by irradiation with active rays or radiation or heat. In this case, the adhesive layer can be specifically a layer having adhesiveness before it is irradiated with active rays or radiation or heat but the adhesiveness decreases or is lost in regions irradiated with active rays or radiation or heat.

<<<Compounds Capable of Generating an Acid when Heated>>>

Compounds capable of generating an acid when heated (hereinafter also simply referred to as "thermal acid generators") that can be used include known thermal acid generators.

Thermal acid generators preferably include compounds having a thermal decomposition point in the range of 130° C. to 250° C., more preferably 150° C. to 220° C. Thermal acid generators include, for example, compounds capable of generating an acid with low nucleophilicity when heated, such as a sulfonic acid, a carboxylic acid or a disulfonyl imide.

The acid generated from the thermal acid generators is preferably a strong acid having a pKa of 2 or more such as a sulfonic acid, an alkyl or aryl carboxylic acid substituted by an electron-withdrawing group, a disulfonyl imide also substituted by an electron-withdrawing group or the like. The electron-withdrawing group includes a halogen atom such as fluorine atom, a haloalkyl group such as trifluoromethyl, nitro, or cyano.

Thermal acid generators that can be applied include photoinduced acid generators capable of generating an acid when irradiated with active rays or radiation. For example, they include onium salts such as sulfonium salts and iodonium salts; N-hydroxyimide sulfonate compounds, oxime sulfonates, o-nitrobenzyl sulfonate and the like.

Further, sulfonic acid esters substantially incapable of generating an acid when irradiated with active rays or radiation but capable of generating an acid when heated are also preferably used in the present invention.

A compound substantially incapable of generating an acid when irradiated with active rays or radiation can be identified by infrared (IR) absorption spectrometry or nuclear magnetic resonance (NMR) spectrometry, which detects no spectral change before and after the compound is exposed.

The sulfonic acid esters preferably have a molecular weight of 230 to 1,000, more preferably 230 to 800. Sulfonic acid esters that can be used in the present invention are commercially available or synthesized by known methods. The sulfonic acid esters can be synthesized by, for example, reacting a sulfonyl chloride or a sulfonic anhydride with an appropriate polyhydric alcohol under basic conditions.

The thermal acid generators may be used alone or as a combination of two or more of them.

The amount of the thermal polymerization initiator contained in the adhesive composition of the present invention is preferably 0.01 to 50% by mass, more preferably 0.1 to 20% by mass, most preferably 0.5 to 10% by mass based on the total solids of the adhesive composition in order that the adhesiveness of the adhesive layer can be reduced when it is irradiated with heat before a member to be processed and an adhesive support are temporarily bonded while the adhesiveness of the adhesive layer can be improved when it is irradiated with heat after a member to be processed and an adhesive support have been temporarily bonded.

The thermal polymerization initiator may be used alone or as a combination of two or more.

<<Other Components>>

In addition to the components described above, the adhesive composition (therefore, the adhesive layer) may further contain various compounds depending on the purposes so far as the advantages of the present invention are not adversely affected.

For example, sensitizing dyes, chain transfer agents, polymerization inhibitors, and surfactants can be preferably used.

Specific examples and preferred examples of surfactants that may be contained in the adhesive composition (therefore, the adhesive layer) are the same as the surfactants that may be contained in the release layer composition described above.

In the present invention, the adhesive composition preferably comprises a binder, a polymerizable monomer, a photoinitiator and a thermal polymerization initiator.

The adhesive composition according to the present invention may contain a rubber. As used herein, the "rubber" means to include any natural rubbers and synthetic rubbers as well as elastomers. Silicone rubbers may also be used.

Preferably, such a rubber is preferably contained at 4 to 20% by mass, more preferably 10 to 18% by mass, even more preferably 14 to 17% by mass based on the total solids of the adhesive composition.

More preferably, the rubber contains repeat monomer units of ethylene and propylene. The amount of the ethylene monomer in the rubber is preferably 40 to 70% by mass, more preferably 40 to 60% by mass, even more preferably 40 to 50% by mass when the total weight of the rubber is 100% by mass. The amount of the propylene monomer in the rubber is preferably 35 to 65% by mass, more preferably 35 to 55% by mass, even more preferably 35 to 45% by mass when the total weight of the rubber is 100% by mass.

Still more preferably, the rubber further contains a small amount of a non-conjugated diene (e.g., an ethylidene norbornene monomer). The amount of the non-conjugated diene in the rubber is preferably 1 to 10% by mass, more preferably 2 to 6% by mass, even more preferably 2 to 3% by mass when the total weight of the rubber is 100% by mass.

Especially preferred rubbers are ethylene-propylene-diene monomers or ethylene-propylene terpolymers called EPDMs. Ethylene-propylene terpolymers are commercially available under the brand name BUNA (registered trademark) EP from Lanxess.

A silicone rubber that can be used includes a material available from WACKER, Burghausen under the brand name ELASTOSIL LR 3070 having a Shore A hardness of 50.

Further, the rubber may be used as a mixture with a dissolved hydrocarbon resin. The hydrocarbon resin is preferably contained at 65 to 95% by mass, more preferably 75 to 95% by mass, even more preferably 80 to 90% by mass based on the total solids.

The hydrocarbon resin to be mixed with the rubber can be selected from the group consisting of terpene rosins, gum rosins, wood rosins, and mixtures thereof. Preferred hydrocarbon resins are commercially available under the brand name Eastotac from Eastman Chemical Company.

The polysiloxane polymers described in paragraphs 0013 to 0015 of JPA2013-048215 or the silphenylene-containing compounds described in paragraphs 0021 to 0027 of the same document may also be used.

<Methods for Manufacturing Semiconductor Devices>

Next, adhesive supports using the temporary bonding laminates for used in a manufacture of semiconductor devices according to the present invention described above and methods for manufacturing semiconductor devices (hereinafter also referred to as "methods for manufacturing semiconductor devices according to the present invention") are explained below.

The methods for manufacturing semiconductor devices according to the present invention comprise: bonding a first surface of a member to be processed and a substrate via a temporary bonding laminate for used in a manufacture of semiconductor devices according to the present invention; subjecting the member to be processed to a heat treatment having a maximum attainable temperature in the range of 180° C. to 370° C. to give a processed member; and debonding the processed member from the bonding layers; characterized in that the first release layer has a softening point higher than the maximum attainable temperature in the heat treatment.

Each step is explained below.

The methods for manufacturing semiconductor devices according to the present invention comprise performing a heat treatment. The performing a heat treatment is not specifically limited so far as it is a step comprising heating in a manufacturing process of a semiconductor device, but preferably e.g., a step comprising heating a thinned silicon substrate supported on an adhesive support, more preferably a step comprising a heat treatment during the formation of through-silicon vias.

The performing a heat treatment in the methods for manufacturing semiconductor devices according to the present invention is a step comprising a heat treatment having a maximum attainable temperature in the range of 180° C. to 370° C., preferably a step comprising a heat treatment having a maximum attainable temperature in the range of 180 to 250° C. The softening point of the first release layer is preferably higher than the maximum attainable temperature in the heat treatment by 10 to 50° C., more preferably 20 to 50° C. When it is in such ranges, the advantages of the present invention are achieved more effectively. The heat treatment preferably comprises heating at the maximum attainable temperature for 30 seconds to 30 minutes, more preferably heating at the maximum attainable temperature for 1 minute to 10 minutes.

Further, the methods processes preferably also comprise irradiating the adhesive layer of the temporary bonding laminate with active rays or radiation or heat before the step of bonding the first surface of the member to be processed and the substrate via the temporary bonding laminate.

Further, the methods preferably also comprise removing the temporary bonding laminate remaining on the processed member using a stripping solvent after debonding the processed member from the temporary bonding laminate.

In the methods for manufacturing semiconductor devices according to the present invention, the stripping solvent preferably comprises at least one of a hydrocarbon solvent and an ether solvent.

In the embodiment described above, the methods may further comprise removing the adhesive layer remaining on the processed member using a stripping solvent after debonding the processed member from the bonding layers. The stripping solvent here is preferably selected from a hydrocarbon solvent and an ether solvent or a combination thereof, more preferably selected from cyclopentane, n-hexane, cyclohexane, n-heptane, limonene, p-menthane, tetrahydrofuran (THF), 1,3-dioxolane and anisole or a combination thereof, even more preferably comprises at least one of tetrahydrofuran, 1,3-dioxolane and anisole.

The methods for manufacturing semiconductors according to the present invention are explained in more detail below.

FIG. 1A, FIG. 1B and FIG. 1C are a schematic sectional view illustrating how to temporarily bond an adhesive support and a device wafer, a schematic sectional view showing the device wafer temporarily bonded to the adhesive support, and a schematic sectional view showing the device wafer temporarily bonded to the adhesive support after it has been thinned, respectively.

In an embodiment of the present invention, an adhesive support 100 comprising an adhesive layer 11 on a carrier substrate 12 is first provided, as shown in FIG. 1A.

The carrier substrate 12 is not specifically limited to any materials, and includes, for example, a silicon substrate, a glass substrate, a metal substrate or the like, preferably a silicon substrate because it is less likely to contaminate silicon substrates typically used as substrates for semiconductor devices and it allows the use of an electrostatic chuck commonly used in manufacturing methods of semiconductor devices.

The thickness of the carrier substrate 12 is, for example, in the range of 300 μm to 5 mm, but not specifically limited.

FIG. 2 is a schematic top view of an adhesive support according to an embodiment of the present invention.

In the embodiment of the present invention, the adhesive layer 11 in the adhesive support is formed of high adhesion regions 11A as dot regions, and low adhesion regions 11B as peripheral regions surrounding the dot regions, as shown in FIG. 2. The low adhesion regions 11B and the high adhesion regions 11A here are distributed at an approximately equal distance over the entire surface of the adhesive layer 11 to form a halftone pattern.

The low adhesion regions 11A and the high adhesion regions 11B are formed by pattern exposure to produce a halftone image on the adhesive layer having adhesiveness that increases or decreases by irradiation with active rays or radiation.

The pattern exposure to produce a halftone image is preferably performed in such a manner that the dot regions of the halftone pattern in the adhesive layer are the high adhesion regions while the peripheral regions surrounding the dot regions are the low adhesion regions.

Preferably, each dot region has an area of 0.0001 to 9 mm$^2$, more preferably 0.1 to 4 mm$^2$, most preferably 0.01 to 2.25 mm$^2$.

The pattern exposure to produce a halftone image may be mask exposure or maskless exposure, but preferably mask exposure through a photomask in which light-transmitting regions and light-shielding regions form a halftone pattern, and in which case the area rate of the light-shielding regions (i.e., the abundance of halftone dots on the bonding surface) is preferably 1 to 20%, more preferably 1 to 10%, most preferably 1 to 5% in the mask because of adhesiveness and releasability.

Further, the morphology (size, shape and the like) of the light-shielding regions corresponding to the halftone dots in the halftone pattern of the photomask can be selected at will, and each light-shielding region may be in the shape of, for example, a circle, square, rectangle, diamond, triangle or star or a combination of two or more of them of any size.

As used herein, the "low adhesion regions" refer to regions having lower adhesiveness as compared with "high adhesion regions", and includes regions having no adhesiveness (i.e., "non-adhesive regions"). Similarly, the "high adhesion regions" refer to regions having higher adhesiveness as compared with "low adhesion regions".

The adhesive layer 11 can be formed by applying (preferably coating) an adhesive layer composition according to the present invention in the form of a layer on the carrier substrate 12 using a known technique such as spin coating, spray coating, roller coating, flow coating, blade coating, dip coating or the like, and then drying it. The adhesive layer may be baked after the adhesive layer composition has been applied in the form of a layer. The baking temperature is preferably 50 to 350° C., more preferably 80 to 120° C. The baking time is preferably 10 seconds to 5 minutes.

The surface of the adhesive layer of the present invention comprises two or more classes of regions having different bond strengths.

As used herein, the bond strength refers to the bond strength determined when a silicon wafer is bonded to the surface of each region and subjected to a tensile test at 250 mm/min in a direction perpendicular to the bonding surface.

The thickness of the adhesive layer 11 is, for example, in the range of 1 to 500 μm, more preferably 1 to 100 μm, but not specifically limited.

A first release layer and a second release layer can be formed by applying (preferably coating) a first release layer composition and a second release layer composition in the form of a layer on a member to be processed using a known technique such as spin coating, spray coating, roller coating, flow coating, blade coating, dip coating or the like, and then drying them.

The first release layer may be baked after the first release layer composition has been applied in the form of a layer. Baking conditions preferably include 50 to 350° C., more preferably 60 to 200° C. The baking time is preferably 30 seconds to 10 minutes. Baking may be performed in two stages, in which case a first stage of baking is preferably performed at a temperature lower than a second stage of baking by about 30 to 200° C.

The thickness of the first release layer is, for example, in the range of 0.1 to 100 μm, more preferably 1 to 10 μm. The first release layer may have such a small thickness because it is used solely for the purpose of keeping the second release layer and the adhesive layer out of contact with each other.

The second release layer may also be baked after the second release layer composition has been applied in the form of a layer. Baking conditions preferably include 30 to 300° C., more preferably 30 to 300° C. The baking time is preferably 30 seconds to 10 minutes. Baking may be performed in two stages, in which case a first stage of baking is preferably performed at a temperature lower than a second stage of baking by about 30 to 200° C.

The thickness of the second release layer is, for example, in the range of 1 to 500 μm, more preferably 20 to 100 μm, even more preferably 50 to 100 μm, but not specifically limited.

Next, temporarily bonding the adhesive support obtained as described above and a device wafer, thinning the device wafer, and debonding the device wafer from the adhesive support are explained in detail below.

As shown in FIG. 1A, a device wafer 60 (processed member) comprises multiple device chips 62 on a frontside 61a of a silicon substrate 61. A first release layer 71-1 and a second release layer 71-2 are provided on the frontside of the device wafer 60 having the device chips 62.

The thickness of the silicon substrate 61 is, for example, in the range of 200 to 1200 μm.

Then, the surface of the first release layer 71-1 is applied on the adhesive layer 11 of the adhesive support 100. Thus, the surface of the first release layer 71-1 and the adhesive layer 11 is bonded to form a temporary bonding laminate 80 comprising the first release layer 71-1 and the adhesive layer 11, as shown in FIG. 1B.

Then, the bonded assembly of the adhesive support 100 and the device wafer 60 may be heated (irradiated with heat) to strengthen the adhesive layer, if desired. This allows the adhesiveness of the adhesive support 100 to be higher because it prevents the adhesive layer from cohesive failure that would be likely to occur during a mechanical or chemical process of the device wafer 60 as described later. Especially, the adhesive layer preferably contains a thermal polymerization initiator because a crosslinking reaction in a reactive compound containing a crosslinkable group can be promoted by heat.

Then, the backside 61b of the silicon substrate 61 is subjected to a mechanical or chemical process, specifically a thinning process such as grinding or chemical mechanical polishing (CMP), thereby reducing the thickness of the silicon substrate 61 (e.g., to a thickness of 1 to 200 μm) to give a thinned device wafer 60', as shown in FIG. 1C.

A further mechanical or chemical process after the thinning process comprises forming through-holes (not shown) through the silicon substrate from the backside 61b' of the thinned device wafer and forming through-silicon vias (not shown) in the through-holes. The process of forming through-silicon vias comprises performing a heat treatment having a maximum temperature lower than the softening point of the first release layer 71-1. Specifically, the maximum attainable temperature in the heat treatment is preferably in the range of 180° C. to 370° C.

Then, the frontside 61a of the thinned device wafer 60' is debonded from the adhesive layer 11 of the adhesive support 100.

The debonding method is not specifically limited, but preferably comprises sliding the thinned device wafer 60' against the adhesive support 100 or separating the thinned device wafer 60' from the adhesive support 100. These methods allow the adhesive layer 11 and the frontside 61a of the thinned device wafer 60' to be readily released from the temporary bond.

After the thinned device wafer 60' is debonded from the adhesive support 100, the thinned device wafer 60' is subjected various known processes as appropriate to prepare a semiconductor device comprising the thinned device wafer 60'.

In the present invention, the temporary bonding method is not limited so far as a device wafer and a carrier substrate are bonded via a temporary bonding laminate comprising a release layer and an adhesive layer, and may comprise preparing a temporary bonding laminate having a release layer on an adhesive layer in advance and bonding a carrier substrate and a device wafer to the adhesive layer and the release layer in this temporary bonding laminate, respectively.

Further, the present invention also relates to a laminate comprising a support such as a carrier substrate, a member to be processed such as a device wafer, and a temporary bonding laminate provided between the support and the member to be processed.

Next, a conventional embodiment is explained.

FIG. 13 is a schematic sectional view illustrating how an adhesive support and a device wafer are released from a temporary bond according to a prior art.

In the conventional embodiment, an adhesive support 100' and a device wafer are temporarily bonded by the same procedure as explained with reference to FIG. 1A and FIG. 1B except that the adhesive support 100' comprises an adhesive layer 11' formed of a conventional temporary bonding agent on a carrier substrate 12 as shown in FIG. 13, then the silicon substrate in the device wafer is thinned, and then a thinned device wafer 60' having the silicon substrate 61 is separated from the adhesive support 100'.

When a conventional temporary bonding agent is used, however, it is difficult to temporarily support a member to be processed securely and readily and to readily release a processed member from a temporary support without damaging the processed member. If a conventional temporary bonding agent having high adhesiveness is employed to sufficiently temporarily bond the device wafer and the carrier substrate, for example, the temporary bond between the device wafer and the carrier substrate tends to be excessively strong. If a tape (e.g., a dicing tape) 70 is adhered to the backside 61b' of the thinned device wafer 60' and the thinned device wafer 60' is separated from the adhesive support 12 to resolve this excessively strong temporary bond, as shown in FIG. 13 for example, bumps 63 drop off from device chips 62 on which the bumps 63 are provided or otherwise the device chips 62 are disadvantageously likely to be broken.

If a conventional temporary bonding agent having low adhesiveness is employed, however, the temporary bond between the device wafer and the carrier substrate is too weak to securely support the device wafer on the carrier substrate.

In contrast, an adhesive layer formed of an adhesive composition of the present invention exhibits sufficient adhesiveness and the temporary bond between the device wafer 60 and the adhesive support 100 can be readily resolved because the adhesive layer 11 comprises high adhesion regions and low adhesion regions. Thus, the release layer 71 in the temporary bonding laminate of the present invention allows the device wafer 60 to be temporarily bonded securely and readily and the thinned device wafer 60' to be readily debonded without damaging the thinned device wafer 60'.

The methods for manufacturing semiconductor devices according to the present invention are not limited to the embodiment described above, but modifications, improvements and the like can be made as appropriate.

Figure 3:
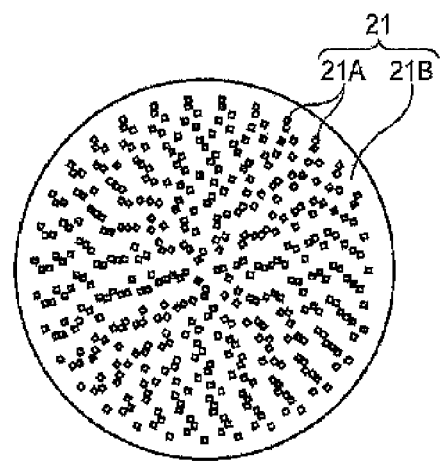
FIG. 3 is a schematic top view of an adhesive support according to an embodiment of the present invention.

The shape of the halftone pattern in the adhesive layer is not specifically limited, and an adhesive layer 21 may be formed to have a halftone pattern comprising high adhesion regions 21A and low adhesion regions 21B wherein the high adhesion regions 21A extend outward from the center to form a radial pattern, as shown in the schematic top view of FIG. 3, for example.

Figure 4:
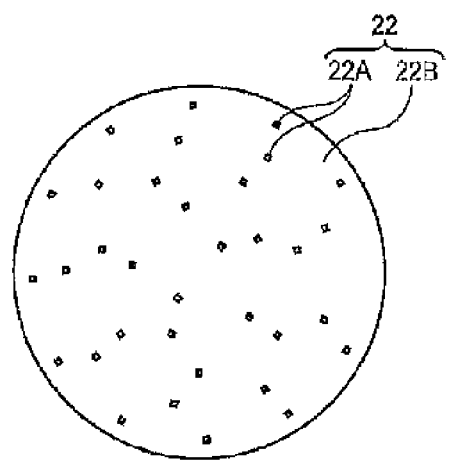
FIG. 4 is a schematic top view of an adhesive support according to an embodiment of the present invention.
Figure 5:
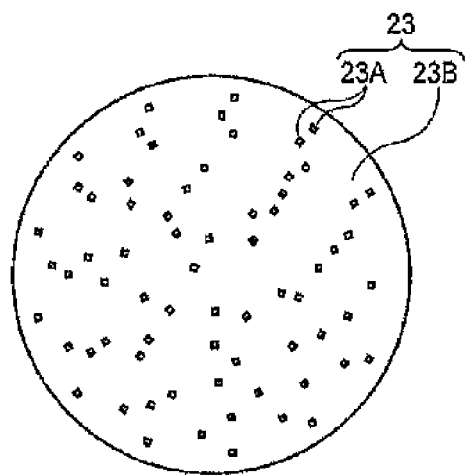
FIG. 5 is a schematic top view of an adhesive support according to an embodiment of the present invention.
Figure 6:
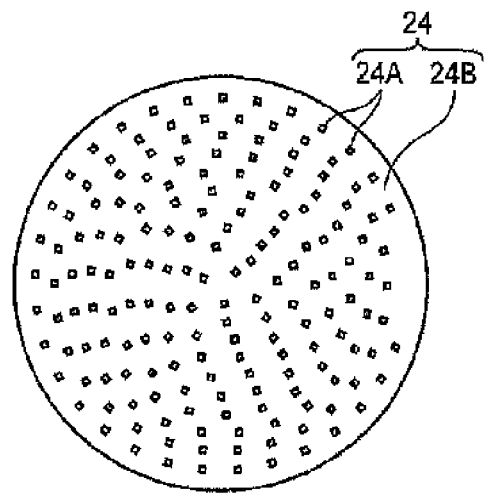
FIG. 6 is a schematic top view of an adhesive support according to an embodiment of the present invention.

Alternatively, adhesive layers 22, 23, 24 may be formed to have a pattern comprising high adhesion regions 22A, 23A, 24A and low adhesion regions 22B, 23B, 24B wherein the high adhesion regions 22A, 23A, 24A extend outward from the center to form a radial pattern and have an area rate lower than the area rate of the high adhesion regions 21A in the adhesive layer 21 (see FIG. 3), as shown in the schematic top views of FIGS. 4, 5, and 6.

Figure 7:
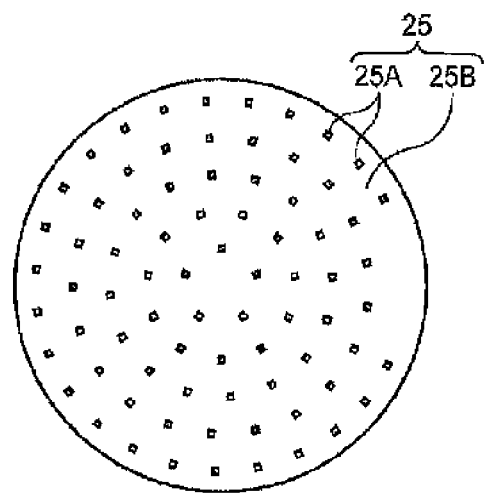
FIG. 7 is a schematic top view of an adhesive support according to an embodiment of the present invention.
Figure 8:
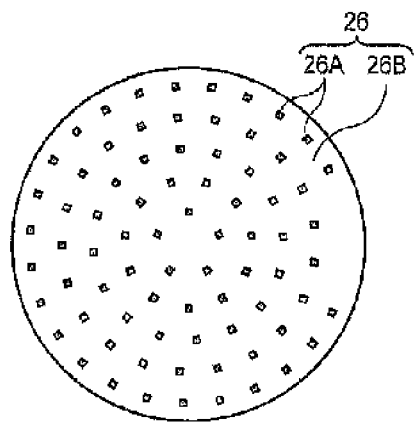
FIG. 8 is a schematic top view of an adhesive support according to an embodiment of the present invention.
Figure 9:
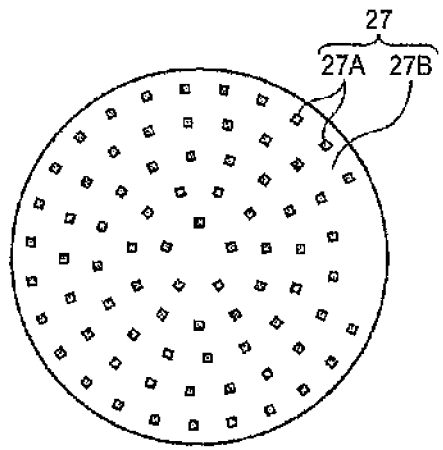
FIG. 9 is a schematic top view of an adhesive support according to an embodiment of the present invention.
Figure 10:
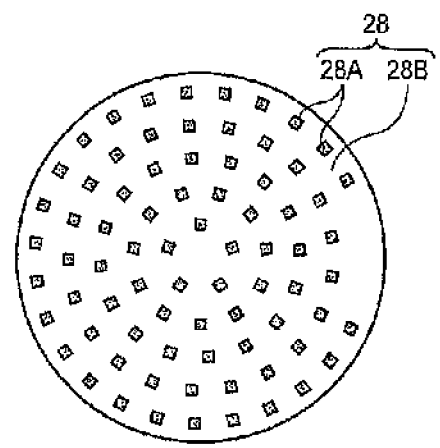
FIG. 10 is a schematic top view of an adhesive support according to an embodiment of the present invention.
Figure 11:
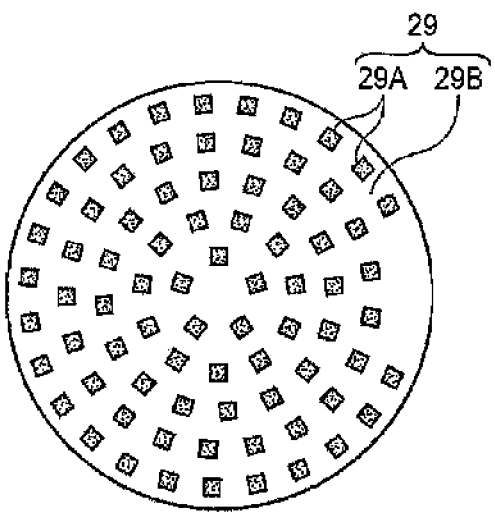
FIG. 11 is a schematic top view of an adhesive support according to an embodiment of the present invention.

Further, the size of each high adhesion region in the halftone pattern is not specifically limited, and adhesive layers 25, 26, 27, 28, 29, 30 comprising high adhesion regions 25A, 26A, 27A, 28A, 29A, 30A and low adhesion regions 25B, 26B, 27B, 28B, 29B, 30B may be formed wherein the high adhesion regions 25A, 26A, 27A, 28A, 29A, 30A have a size changed from the size of the high adhesion regions 11A in the adhesive layer 11 (see FIG. 2), as shown in FIG. 7, 8, 9, 10, 11, 12.

Although an adhesive layer formed of an adhesive composition of the present invention is provided on a carrier substrate to form an adhesive support before it is temporarily bonded to a device wafer in the embodiment described above, it may be first provided on a release layer to form a temporary bonding laminate, in which case the adhesive layer and the release layer in the temporary bonding laminate are bonded to a carrier substrate and a device wafer, respectively.

For example, the mask used for pattern exposure may be a binary mask or a halftone mask.

Although exposure is performed through a mask, it may be selective exposure using an electron beam or the like.

Further, the embodiment described above preferably further comprises irradiating the adhesive layer of the temporary bonding laminate with active rays or radiation or heat before bonding the first surface of the member to be processed and the substrate via the temporary bonding laminate.

Although the adhesive layer is a monolayer structure in the embodiment described above, the adhesive layer may be a multilayer structure. An adhesive layer having a multilayer structure may be formed by coating an adhesive composition stepwise by any one of the known techniques described above before irradiation with active rays or radiation; or coating an adhesive composition by any one of the known techniques described above after irradiation with active rays or radiation or the like. In an embodiment comprising an adhesive layer having a multilayer structure wherein the adhesive layer 11 is an adhesive layer having adhesiveness that decreases by irradiation with active rays or radiation or heat, for example, the adhesiveness of the adhesive layer as a whole can be decreased by decreasing adhesion between layers by irradiation with active rays or radiation or heat.

Further, the member to be processed supported on the adhesive support is not limited to a silicon substrate as mentioned in the embodiment described above, but may be any member to be processed capable of being subjected to a mechanical or chemical process during manufacturing processes of semiconductor devices.

For example, the member to be processed may also be a compound semiconductor substrate, and specific examples of compound semiconductor substrates include SiC substrates, SiGe substrates, ZnS substrates, ZnSe substrates, GaAs substrates, InP substrates, and GaN substrates and the like.

Further, the mechanical or chemical process of the silicon substrate supported by the adhesive support is not limited to thinning of the silicon substrate and formation of through-silicon vias as mentioned in the embodiment described above, but may be any necessary process in manufacturing processes of semiconductor devices.

Further, the shape, size, number, location and the like of the light-transmitting regions and light-shielding regions in the mask, the high adhesion regions and low adhesion regions in the adhesive layer, and the device chips in the device wafer are not limited to the examples shown in the embodiment described above, but may be any values so far as the present invention can be achieved.

EXAMPLES

The following examples further illustrate the present invention, but the present invention is not limited to these examples and changes may be made without departing from the spirit of the invention. Unless otherwise specified, "parts" and "%" are based on mass.

<Formation of an Adhesive Support (Adhesive Layer (B))>

A 4-inch Si wafer was coated with each liquid adhesive composition consisting of the components shown in Table 1 below using a spin coater (Opticoat MS-A100 from Mikasa, 1200 rpm, 30 seconds), and then baked under the baking conditions described in Table 1 to form a wafer 1 provided with an adhesive layer having a thickness of 10 μm (i.e., an adhesive support). Then, the adhesive layer was exposed at 2000 mJ/cm$^2$ to produce a halftone image by irradiation from the side of the adhesive layer of the wafer 1 using a UV exposure system (LC8 from Hamamatsu Photonics K.K.) through a photomask having a halftone pattern consisting of light-transmitting regions and light-shielding regions wherein the light-shielding regions are dot regions in the halftone pattern. Exposure was performed while the shape of each dot region (light-shielding region) of the photomask was changed as shown in Table 3 in each Example (Table 3 also shows the area rate of light-transmitting regions in each photomask). The pattern formed by dot regions (high adhesion regions) on the surface of the adhesive layer is a pattern as shown in FIG. 2.

TABLE 1

| | Binder | | Polymerizable monomer | | Photoinitiator | | Thermal polymerization initiator | | Solvent | | Baking conditions |
|---|---|---|---|---|---|---|---|---|---|---|---|
| | Type | Content (parts) | Type | Content (parts) | Type | Content (parts) | Type | Content (parts) | Type | Content (parts) | |
| Adhesive composition 1 | Resin (1) | 50 | Polymerizable monomer (1) | 50 | Photoinitiator (1) | 5 | Thermal polymerization initiator (1) | 5 | S1 | 150 | 100° C. 30 seconds |
| Adhesive composition 2 | Resin (1) | 50 | Polymerizable monomer (2) | 50 | Photoinitiator (1) | 5 | Thermal polymerization initiator (1) | 5 | S2 | 150 | 100° C. 30 seconds |
| Adhesive composition 3 | Resin (2) | 50 | Polymerizable monomer (1) | 50 | Photoinitiator (1) | 5 | Thermal polymerization initiator (1) | 5 | S3 | 150 | 100° C. 30 seconds |

TABLE 1-continued

| | Binder | | Polymerizable monomer | | Photoinitiator | | Thermal polymerization initiator | | Solvent | | Baking conditions |
|---|---|---|---|---|---|---|---|---|---|---|---|
| | Type | Content (parts) | Type | Content (parts) | Type | Content (parts) | Type | Content (parts) | Type | Content (parts) | |
| Adhesive composition 4 | Resin (3) | 10 | none | — | none | — | none | — | S4 | 100 | 100° C. 60 seconds |
| | Resin (4) | 50 | | | | | | | | | |

The compounds described in Table 1 are as follows.
<Binders>
Resin (1): ESTYRENE MS200NT (an MS resin from Nippon Steel Chemical Co., Ltd.)
Resin (2): ZEONEX 480R (a cycloolefin resin from Zeon Corporation)
Resin (3): Buna EP T6250 (an ethylene-propylene terpolymer rubber from LANXESS)
Resin (4): Eastotac H-142W (a hydrocarbon resin from Eastman Chemical Company)
<Polymerizable Monomers>
Polymerizable monomer (1): A-DCP (a bifunctional acrylate from Shin-Nakamura Chemical Co., Ltd.)
Polymerizable monomer (2): A-BPE-4 (a bifunctional acrylate from Shin-Nakamura Chemical Co., Ltd.)
<Photoinitiator>
Photoinitiator (1): KAYACURE DETX-S(2,4-dimethylthioxanthone from Nippon Kayaku Co., Ltd.)
<Thermal Polymerization Initiator>
Thermal polymerization initiator (1): PERBUTYL Z (tert-butyl peroxybenzoate from NOF CORPORATION)
<Solvents>
S1: Methyl amyl ketone
S2: PGMEA (propylene glycol 1-monomethyl ether 2-acetate)
S3: Limonene
S4: 1-Dodecene
<Formation of a Member to be Processed (Release Layer (A))>
A 4-inch Si wafer provided with Cu electrodes having a height of 10 µm and a diameter of 50 µm at a distance of 200 µm on its surface was coated with each liquid second release layer composition consisting of the components shown in Table 2 below on the side having these electrodes using a spin coater (Opticoat MS-A100 from Mikasa, 1200 rpm, 30 seconds), and then baked under the conditions described in Table 2 to form a wafer 2 provided with a second release layer (a2) having a thickness of 40 µm. Baking was performed in two stages. Specifically, a first stage of baking was performed at the temperature and for the time described in each upper row in Table 2, and a second stage of baking was performed at the temperature and for the time described in each lower row in Table 2.

The wafer 2 was further coated with each liquid first release layer composition consisting of the components shown in Table 3 below using a spin coater (Opticoat MS-A100 from MIKASA Co., LTD., 600 rpm, 30 seconds), and then baked under the conditions described in Table 3 to form a wafer 2 provided with a first release layer (a1) having a thickness of 5 µm. Baking was performed in two stages. Specifically, a first stage of baking was performed at the temperature and for the time described in each upper row in Table 3, and a second stage of baking was performed at the temperature and for the time described in each lower row in Table 3.

The softening point of the first release layer resin was determined using the viscoelastometer Rheosol-G5000 (from UBM). Specifically, the softening point of the first release layer is determined as the temperature at which the loss tangent (tan δ) measured using a viscoelastometer under predetermined heating conditions is maximum. In the Examples, it was determined using the viscoelastometer Rheosol-G5000 when the temperature of the release layer was raised from 25° C. to 500° C. at a heating rate of 5° C./min and a strain of an angle of 0.05° was applied to the first release layer at a frequency of 1 Hz.

TABLE 2

| | Binders | | Solvents | | |
|---|---|---|---|---|---|
| Second release layer composition | Type | Content (%) | Type | Content (%) | Baking conditions |
| Resin solution 2-1 | Resin (2-1) | 20 | THF | 80 | 40° C. 5 minutes<br>80° C. 10 minutes |
| Resin solution 2-2 | Resin (2-2) | 25 | Cyclohexanone | 75 | 100° C. 5 minutes<br>250° C. 10 minutes |
| Resin solution 2-3 | Resin (2-3) | 30 | PGMEA | 70 | 100° C. 5 minutes<br>150° C. 10 minutes |
| Resin solution 2-4 | Resin (2-4) | 25 | Methyl amyl ketone | 75 | 60° C. 5 minutes<br>150° C. 10 minutes |
| Resin solution 2-5 | Resin (2-5) | 30 | Xylene/N-methyl-2-pyrrolidone[20% by mass/80% by mass] | 70 | 100° C. 5 minutes<br>250° C. 20 minutes |

Resin (2-1): TOPAS 5013 (from Polyplastics Co., Ltd.)
Resin (2-2): Panlite L-1225LM (a polycarbonate resin from TEIJIN LIMITED)
Resin (2-3): ESTYRENE MS200NT (an MS resin from Nippon Steel Chemical Co., Ltd.)
Resin (2-4): L-70 (a cellulose acetate resin from Daicel Corporation)
Resin (2-5): VYLOMAX HR-13NX (a polyimide resin that becomes insoluble in solvents by baking from TOYOBO CO., LTD.)

TABLE 3

| First release layer composition | Binders Type | Content (%) | Solvents Type | Content (%) | Baking conditions | Softening point of the first release layer(° C.) |
|---|---|---|---|---|---|---|
| Resin solution 1-1 | Resin (1-1) | 20 | N-methyl-2-pyrrolidone(NMP) | 80 | 100° C. 5 minutes 250° C. 10 minutes | 310 |
| Resin solution 1-2 | Resin (1-2) | 25 | N-ethyl-2-pyrrolidone | 75 | 100° C. 5 minutes 250° C. 10 minutes | 240 |
| Resin solution 1-3 | Resin (1-3) | 10 | N, N-dimethylacetamide | 90 | 100° C. 5 minutes 250° C. 10 minutes | 430 |
| Resin solution 1-4 | Resin (1-4) | 25 | Methyl amyl ketone | 75 | 100° C. 5 minutes 150° C. 10 minutes | 320 |
| Resin solution 1-5 | Resin (1-5) | 30 | p-xylene | 70 | 100° C. 5 minutes 150° C. 10 minutes | 220 |
| Resin solution 1-6 | Resin (1-6) | 25 | Limonene | 75 | 100° C. 5 minutes 150° C. 10 minutes | 135 |
| Resin solution 1-7 | Resin (1-7) | 20 | NMP | 80 | 200° C. 10 minutes 300° C. 30 minutes | 470 |

Resin (1-1): Durimide 10 (a polyimide resin from FUJIFILM Corporation)
Resin (1-2): Ultrason E 6020 (a polyether sulfone resin from BASF)
Resin (1-3): MRS0810H (a polybenzimidazole resin from SATO LIGHT INDUSRIAL Co., LTD.)
Resin (1-4): RICACOAT (a polyamideimide resin from New Japan Chemical Co., Ltd.)
Resin (1-5): Xyron S201A (a polyphenylene ether resin from ASAHI Kasei Corp.)
Resin (1-6): TOPAS 5013 (a cycloolefin resin from Polyplastics Co., Ltd.)
Resin (1-7): U-Varnish-S (a polyimide resin from Ube Industries, Ltd.)

<Preparation of Adhesion Test Specimens>

Test specimens were prepared by bonding the wafer 1 and the wafer 2 in each combination described in Table 3 below under heat and pressure.

<<Pressure Bonding>>

A 4-inch Si wafer having no coating on the surface or a 4-inch Si wafer provided with a release layer (hereinafter referred to as wafer 2) was divided into sample pieces of 20 mm×30 mm. Wafer 1 was divided into sample pieces of 20 mm×30 mm in the same manner, and overlaid on the wafer having no coating on the surface or the first release layer of the wafer 2 in such a manner that the adhesive layer comes into contact with it in a square of 20 mm×20 mm and bonded under pressure and heat at 1 N/cm$^2$, 120° C. for 3 minutes.

<Determination of the Bond Strength of Laminate Test Specimens>

The prepared test specimens were measured for their shear bond strength using a tensile tester (from IMADA CO., LTD.) in a direction along the plane of the adhesive layer under the conditions of 250 mm/min. The results are shown in Table 4 or 5 below.

<Determination of the Peel Strength and Peel Strength after Heating of Laminate Test Specimens>

The prepared sample pieces were subjected to a tensile test in a direction perpendicular to the plane of the adhesive layer under the conditions of 250 mm/min (determination of peel strength). Further, the prepared sample pieces were heated at each temperature described in Table 4 or 5 for 30 minutes, and then subjected to a tensile test in a direction perpendicular to the plane of the adhesive layer under the conditions of 250 mm/min (determination of peel strength after heating under conditions mimic to the maximum attainable temperature of the process). The results are shown in Table 4 or 5 below.

<Evaluation of the Removal of the Bonding Layers of the Laminate Test Specimens>

After the prepared sample pieces were separated, the wafer 2 was immersed in each solvent described in Table 4 or 5, and the time required for both adhesive layer and release layer to be removed from the wafer 2 was determined. The results are shown in Table 4 or 5 below.

TABLE 4

| | Adhesive layer | Release layer Upper: First release layer Lower: Second release layer | Shape of halftone dots | Abundance of halftone dots (%) | Bond strength | Peel strength | Peel strength after heating Maximum attainable temperature (° C.) | Peel strength | Removal Peeling solvent | Removal Peeling time (minuets) |
|---|---|---|---|---|---|---|---|---|---|---|
| Comparative Example 1 | Adhesive composition 1 | Resin solution 1-1 No second release layer | Not exposure | Adhesion on entire surface | 50 | 6 | 180 | 6 | NMP | >60 |
| Comparative Example 2 | Adhesive composition 1 | No first release layer Resin solution 2-3 | Each side of Square is 1 mm Area is 1 mm$^2$ | 4% | 50 | 8 | 180 | 18 Wafer cracking | THF | 20 |
| Comparative Example 3 | Adhesive composition 1 | Resin solution 1-1 Resin solution 2-5 | Not exposure | Adhesion on entire surface | 50 | 6 | 200 | 6 | NMP | >60 |
| Comparative Example 4 | Adhesive composition 1 | Resin solution 1-6 Resin solution 2-3 | Each side of Square is 1 mm Area is 1 mm$^2$ | 4% | 50 | 5 | 200 | 20 Wafer cracking | THF | 20 |

TABLE 4-continued

| | Adhesive layer | Release layer Upper: First release layer Lower: Second release layer | Shape of halftone dots | Abundance of halftone dots (%) | Bond strength | Peel strength | Peel strength after heating Maximum attainable temperature (° C.) | Peel strength | Removal Peeling solvent | Removal Peeling time (minuets) |
|---|---|---|---|---|---|---|---|---|---|---|
| Comparative Example 5 | Adhesive composition 1 | None | Each side of Square is 1 mm Area is 1 mm² | 4% | 50 | 25 | 25 Wafer cracking | 25 Wafer cracking | NMP | >60 |
| Comparative Example 6 | None | Resin solution 1-1 Resin solution 2-3 | None | — | 0 | — | — | — | — | — |
| Example 1 | Adhesive composition 1 | Resin solution 1-1 Resin solution 2-1 | Not exposure | Adhesion on entire surface | 50 | 6 | 200 | 6 | THF | 20 |
| Example 2 | Adhesive composition 2 | Resin solution 1-1 Resin solution 2-2 | Not exposure | Adhesion on entire surface | 40 | 6 | 200 | 6 | 1,3-dioxolane | 15 |
| Example 3 | Adhesive composition 3 | Resin solution 1-1 Resin solution 2-3 | Not exposure | Adhesion on entire surface | 50 | 6 | 200 | 6 | THF | 20 |

TABLE 5

| | Adhesive layer | Release layer Upper: First release layer Lower: Second release layer | Shape of halftone dots | Abundance of halftone dots (%) | Bond strength | Peel strength | Peel strength after heating Maximum attainable temperature (° C.) | Peel strength | Removal Peeling solvent | Removal Peeling time (minuets) |
|---|---|---|---|---|---|---|---|---|---|---|
| Example 4 | Adhesive composition 1 | Resin solution 1-1 Resin solution 2-4 | Each side of Square is 1 mm Area is 1 mm² | 4% | 50 | 2 | 200 | 3 | Acetone | 10 |
| Example 5 | Adhesive composition 2 | Resin solution 1-2 Resin solution 2-3 | Each side of Square is 1 mm Area is 1 mm² | 4% | 50 | 3 | 200 | 3 | Anisole | 20 |
| Example 6 | Adhesive composition 3 | Resin solution 1-3 Resin solution 2-3 | Each side of Square is 1 mm Area is 1 mm² | 4% | 50 | 3 | 370 | 3 | 1,3-dioxolane | 10 |
| Example 7 | Adhesive composition 1 | Resin solution 1-4 Resin solution 2-3 | Each side of Square is 1 mm Area is 1 mm² | 4% | 50 | 5 | 300 | 5 | Toluene | 25 |
| Example 8 | Adhesive composition 2 | Resin solution 1-5 Resin solution 2-3 | Each side of Square is 1 mm Area is 1 mm² | 4% | 50 | 3 | 200 | 3 | THF | 20 |
| Example 9 | Adhesive composition 2 | Resin solution 1-2 Resin solution 2-3 | Each side of Square is 1 mm Area is 1 mm² | 4% | 50 | 3 | 180 | 3 | Anisole | 20 |
| Example 10 | Adhesive composition 2 | Resin solution 1-2 Resin solution 2-3 | Each side of Square is 1 mm Area is 1 mm² | 4% | 50 | 3 | 220 | 3 | Anisole | 20 |
| Example 11 | Adhesive composition 2 | Resin solution 1-2 Resin solution 2-3 | Each side of Square is 1 mm Area is 1 mm² | 4% | 50 | 3 | 230 | 5 | Anisole | 20 |
| Example 12 | Adhesive composition 4 | Resin solution 1-1 Resin solution 2-1 | Not exposure | Adhesion on entire surface | 50 | 7 | 200 | 7 | THF | 20 |
| Example 13 | Adhesive composition 4 | Resin solution 1-7 Resin solution 2-1 | Not exposure | Adhesion on entire surface | 50 | 3 | 200 | 3 | THF | 30 |

In the tables above, the abundance of halftone dots is expressed in %, and the bond strength, peel strength and peel strength after heating are expressed in N/25 mm².

The results above show that Comparative example 1 not comprising a second release layer exhibited adhesiveness and releasability but insufficient removability; Comparative example 2 not comprising a first release layer exhibited insufficient releasability; Comparative example 3 comprising a first release layer, a second release layer and an adhesive layer wherein the second release layer is solvent-insoluble exhibited adhesiveness and releasability but insufficient removability; Comparative example 4 comprising a first release layer, a second release layer and an adhesive layer wherein the first release layer has a softening point of not 200° C. or more exhibited adhesiveness but insufficient removability; Comparative example 5 not comprising a release layer exhibited insufficient releasability; and Comparative example 6 not comprising an adhesive layer exhibited insufficient adhesiveness. In contrast, Examples 1 to 8 were shown to achieve high adhesiveness, releasability and removability at the same time even after a high temperature process (more specifically at 180° C. to 370° C.) because the first release layer has a softening point of 200° C. or more and the second release layer is solvent-soluble in the temporary bonding laminates of the present invention.

DESCRIPTION OF THE REFERENCE NUMERALS 11, 21 to 30, 11': adhesive layer;
11A, 21A to 30A: high adhesion regions;
11B, 21B to 30B: low adhesion regions;
12: carrier substrate;
60: device wafer;
60': thinned device wafer;
61: silicon substrate
61a: frontside of the silicon substrate;
61b: backside of the silicon substrate;
61b': backside of the thinned device wafer;
62: device chips;
63: bumps;
70: tape;
71: release layer;
71-1: first release layer
71-2: second release layer;
80: temporary bonding laminate;
100, 100': adhesive support.

What is claimed is:

1. A temporary bonding laminate for use in a manufacture of semiconductor devices, comprising (A) a release layer and (B) an adhesive layer,
wherein the release layer (A) comprises (a1) a first release layer having a softening point of 200° C. or more and adjoining the adhesive layer (B), and (a2) a second release layer adjoining the first release layer (a1);
the second release layer (a2) contains a resin;
the adhesive layer (B) comprises a binder, a polymerizable monomer, and at least one of a photoinitiator and a thermal polymerization initiator; and
the resin after curing is capable of being dissolved at 5% by mass or more, at 25° C., in at least one kind of solvents selected from hexane, heptane, ethyl acetate, acetone, methanol, ethanol, isopropanol, 1,4-dioxane, tetrahydrofuran, 1-methoxy-2-propanol, 2-acetoxy-1-methoxypropane, acetonitrile, methyl ethyl ketone, cyclohexanone, toluene, dimethyl sulfoxide, N,N-dimethylformamide, N,N-dimethylacetamide, N-methyl-2-pyrrolidinone, N-ethyl-2-pyrrolidinone, chloroform, methylene chloride, anisole, xylene, and mesitylene.

2. The temporary bonding laminate for use in a manufacture of semiconductor devices according to claim 1,
wherein the first release layer (a1) has a softening point in the range of 200° C. to 450° C.

3. The temporary bonding laminate for use in a manufacture of semiconductor devices according to claim 1, wherein the first release layer (a1) contains a thermoplastic resin.

4. The temporary bonding laminate for use in a manufacture of semiconductor devices according to claim 3, wherein the thermoplastic resin is at least one thermoplastic resin selected from polyether sulfone resins, polyimide resins, polyester resins, polybenzimidazole resins, polyphenylene ether resins, polyphenylene sulfide resins, polyamideimide resins and polyether ketone resins.

5. The temporary bonding laminate for use in a manufacture of semiconductor devices according to claim 1, wherein the resin contained in the second release layer (a2) is at least one member selected from polycarbonate resins, polyurethane resins and hydrocarbon resins.

6. The temporary bonding laminate for use in a manufacture of semiconductor devices according to claim 1, wherein the first release layer (a1) has a thickness of 1 to 10 μm and the second release layer (a2) has a thickness of 20 to 100 μm.

7. The temporary bonding laminate for use in a manufacture of semiconductor devices according to claim 1, wherein the polymerizable monomer has a molecular weight of 1500 or less.

8. The temporary bonding laminate for use in a manufacture of semiconductor devices according to claim 1, wherein the polymerizable monomer is contained in an amount of 10 to 70% by mass based on the total solids of the adhesive layer.

9. The temporary bonding laminate for use in a manufacture of semiconductor devices according to claim 1, wherein the adhesive layer has a mass ratio between the contents of the polymerizable monomer and the binder of from 20/80 to 80/20.

10. A kit including a stripping solvent, comprising a release layer forming composition containing a thermoplastic resin, and an adhesive layer forming composition containing a resin capable of being dissolved at 5% by mass or more in at least one of solvents selected from hexane, heptane, ethyl acetate, acetone, methanol, ethanol, isopropanol, 1,4-dioxane, tetrahydrofuran, 1-methoxy-2-propanol, 2-acetoxy-1-methoxypropane, acetonitrile, methyl ethyl ketone, cyclohexanone, toluene, dimethyl sulfoxide, N,N-dimethylformamide, N,N-dimethylacetamide, N-methyl-2-pyrrolidinone, N-ethyl-2-pyrrolidinone, chloroform, methylene chloride, anisole, xylene, and mesitylene at 25° C. after curing,
wherein the adhesive layer forming composition further contains a binder, a polymerizable monomer, and at least one of a photoinitiator and a thermal polymerization initiator.

11. The kit according to claim 10, further comprising a stripping solvent including at least one of a hydrocarbon solvent and an ether solvent.

* * * * *